United States Patent
Ahn et al.

(10) Patent No.: US 12,247,315 B2
(45) Date of Patent: Mar. 11, 2025

(54) APPARATUS AND METHOD FOR MANUFACTURING HEXAGONAL CRYSTALS

(71) Applicants: LNBS Co. Ltd., Busan (KR); Jae Hak Lee, Seoul (KR); Byunggeun Ahn, Busan (KR); Joo Ho Lee, Seoul (KR)

(72) Inventors: Hyung Soo Ahn, Busan (KR); Jae Hak Lee, Seoul (KR); Byunggeun Ahn, Busan (KR); Joo Ho Lee, Seoul (KR)

(73) Assignees: LNBS CO. LTD., Busan (KR); Jae Hak Lee, Seoul (KR); Byunggeun Ahn, Seoul (KR); Joo Ho Lee, Seoul (KR)

( * ) Notice: Subject to any disclaimer, the term of this patent is extended or adjusted under 35 U.S.C. 154(b) by 141 days.

(21) Appl. No.: 18/111,091

(22) Filed: Feb. 17, 2023

(65) Prior Publication Data
US 2023/0272549 A1     Aug. 31, 2023

(30) Foreign Application Priority Data

Feb. 22, 2022   (KR) .................. 10-2022-0022928
Jun. 27, 2022   (KR) .................. 10-2022-0078260

(51) Int. Cl.
*C30B 25/08*     (2006.01)
*C23C 16/06*     (2006.01)
(Continued)

(52) U.S. Cl.
CPC .............. *C30B 25/08* (2013.01); *C23C 16/06* (2013.01); *C23C 16/24* (2013.01); *C23C 16/303* (2013.01);
(Continued)

(58) Field of Classification Search
CPC ....... C23C 16/06; C23C 16/24; C23C 16/303; C23C 16/325; C23C 16/40; C23C 16/455;
(Continued)

(56) References Cited

U.S. PATENT DOCUMENTS

2007/0277731 A1* 12/2007  Han .................. C30B 35/00
                                                          117/100
2022/0251727 A1*  8/2022  Ahn .................. C23C 16/45512

FOREIGN PATENT DOCUMENTS

JP          02-033270 U  *  3/1990  ............. C30B 23/02
KR    10-2010-0066072       6/2010
(Continued)

OTHER PUBLICATIONS

English computer translation of JP 02-033270U (Year: 2024).*
(Continued)

*Primary Examiner* — Matthew J Song
(74) *Attorney, Agent, or Firm* — LEX IP MEISTER, PLLC

(57) ABSTRACT

An apparatus for manufacturing hexagonal crystals using HVPE includes: a reaction tube; a reaction boat disposed on one side in the reaction tube; a halogenation reaction gas supply pipe for supplying a halogenation reaction gas to the reaction boat; a nitrification reaction gas supply pipe for supplying a nitrification reaction gas to the reaction boat; and a heater for heating the reaction tube. The reaction boat includes a source part for receiving source materials; and a crystal growth part disposed beneath the source part and having a depressed growth mold of a predetermined shape. The source part includes: at least one penetration hole formed on a bottom surface; a first allocating area formed around the at least one penetration hole, for receiving aluminum; and a second allocating area formed around the
(Continued)

first allocating area, for receiving a main material of the hexagonal crystal and gallium.

9 Claims, 39 Drawing Sheets
(23 of 39 Drawing Sheet(s) Filed in Color)

(51) Int. Cl.
        *C23C 16/24*        (2006.01)
        *C23C 16/30*        (2006.01)
        *C23C 16/32*        (2006.01)
        *C23C 16/40*        (2006.01)
        *C23C 16/455*       (2006.01)
        *C23C 16/46*        (2006.01)
        *C30B 25/10*        (2006.01)
        *C30B 25/14*        (2006.01)
        *C30B 29/06*        (2006.01)
        *C30B 29/08*        (2006.01)
        *C30B 29/16*        (2006.01)
        *C30B 29/36*        (2006.01)
        *C30B 29/40*        (2006.01)
        *C30B 29/52*        (2006.01)
        *C30B 29/62*        (2006.01)
        *C30B 29/66*        (2006.01)

(52) U.S. Cl.
    CPC ............ *C23C 16/325* (2013.01); *C23C 16/40* (2013.01); *C23C 16/455* (2013.01); *C23C 16/46* (2013.01); *C30B 25/10* (2013.01); *C30B 25/14* (2013.01); *C30B 29/06* (2013.01); *C30B 29/08* (2013.01); *C30B 29/16* (2013.01); *C30B 29/36* (2013.01); *C30B 29/403* (2013.01); *C30B 29/52* (2013.01); *C30B 29/62* (2013.01); *C30B 29/66* (2013.01)

(58) Field of Classification Search
    CPC ......... C23C 16/46; C30B 25/08; C30B 25/10; C30B 25/14; C30B 29/06; C30B 29/08; C30B 29/16; C30B 29/36; C30B 29/403; C30B 29/52; C30B 29/60; C30B 29/62; C30B 29/66
    See application file for complete search history.

(56) References Cited

FOREIGN PATENT DOCUMENTS

| KR | 10-2013-0052325 | 5/2013 |
|---|---|---|
| KR | 10-2149338 | 8/2020 |
| KR | 10-2022-0013153 | 2/2022 |
| KR | 10-2022-0145620 | 10/2022 |

OTHER PUBLICATIONS

Wu, Tzong-Ming, et al. "Preparation and characterization of polyaniline/multi-walled carbon nanotube composites." Carbon 43.4 (2005): 734-740. Available online on Dec. 8, 2004.
Müller, C., et al. "Growth studies, TEM and XRD investigations of iron-filled carbon nanotubes." Physica status solidi (a) 203.6 (Mar. 20, 2006): 1064-1068.
Gascho, Julia L. S., et al. "Graphene oxide films obtained by vacuum filtration: X-ray diffraction evidence of crystalline reorganization." Journal of Nanomaterials 2019 (Mar. 24, 2019): 1-12.
Kobayashi, Takuma, et al. "Design and formation of SiC (0001)/SiO2 interfaces via Si deposition followed by low-temperature oxidation and high-temperature nitridation." Applied Physics Express 13.9 (Aug. 14, 2020): 091003.
Fadaly, Elham MT, et al. "Direct-bandgap emission from hexagonal Ge and SiGe alloys." Nature 580.7802 (Apr. 8, 2020): 205-209.
Rödl, Claudia, et al. "Accurate electronic and optical properties of hexagonal germanium for optoelectronic applications." Physical Review Materials 3.3 (Mar. 2019): 034602.
Larkin, D. J., et al. "Site-competition epitaxy for controlled doping of CVD silicon carbide." Institute of Physics Conference Series. vol. 137. Bristol [England]; Boston: Adam Hilger, Ltd., c1985-, 1994. pp. 51-54.
Larkin, David J., et al. "Site-competition epitaxy for superior silicon carbide electronics." Applied Physics Letters 65.13 (Jul. 26, 1994): 1659-1661.
Neudeck, Philip G., et al. "Greatly improved 3C-SiC pn junction diodes grown by chemical vapor deposition." IEEE electron device letters 14.3 (Mar. 1993): 136-139.
Marcus, Rudolph A. "Chemical and electrochemical electron-transfer theory." Annual review of physical chemistry 15.1 (Oct. 1964): 155-196.
Snyman, L. W., et al. "An efficient low voltage, high frequency silicon CMOS light emitting device and electro-optical interface." IEEE Electron Device Letters 20.12 (Dec. 1999): 614-617.
Duttagupta, S. P., et al. "Enhancement and suppression of the formation of porous silicon." Journal of Vacuum Science & Technology B: Microelectronics and Nanometer Structures Processing, Measurement, and Phenomena 13.3 (May 1995): 1230-1235.
Hirschman, K. D., et al. "Silicon-based visible light-emitting devices integrated into microelectronic circuits." Nature 384.6607 (Nov. 28, 1996): 338-341.
She, Xu, et al. "Review of silicon carbide power devices and their applications." IEEE Transactions on Industrial Electronics 64.10 (Jan. 16, 2017): 8193-8205.
Raya-Moreno, Marti, et al. "Thermal conductivity of hexagonal Si and hexagonal Si nanowires from first-principles." Applied Physics Letters 111.3 (Jul. 19, 2017): 032107.
Piltz, R. O., et al. "Structure and properties of silicon XII: A complex tetrahedrally bonded phase." Physical Review B 52.6 (Aug. 1, 1995): 4072.
Blanco, Alvaro, et al. "Large-scale synthesis of a silicon photonic crystal with a complete three-dimensional bandgap near 1.5 micrometres." Nature 405.6785 (May 25, 2000): 437-440.
Olijnyk, H., S. K., et al. "Structural phase transitions in Si and Ge under pressures up to 50 GPa." Physics Letters A 103.3 (Jun. 25, 1984): 137-140.
Shin, Naechul, et al. "Rational defect introduction in silicon nanowires." Nano letters 13.5 (Apr. 11, 2013): 1928-1933.
Hauge, Hakon Ikaros T., et al. "Hexagonal silicon realized." Nano letters 15.9 (Jul. 31, 2015): 5855-5860.
Guo, Yaguang, et al. "A new silicon phase with direct band gap and novel optoelectronic properties." Scientific reports 5.1 (Sep. 23, 2015): 1-7.
Raffy, C., J., et al. "Properties of hexagonal polytypes of group-IV elements from first-principles calculations." Physical Review B 66.7 (Aug. 2, 2002): 075201.
Joannopoulos, J. D., et al. "Electronic properties of complex crystalline and amorphous phases of Ge and Si. I. Density of states and band structures." Physical Review B 7.6 (May 1, 1973): 2644.
Chang, Kee-Joo, et al. "Superconductivity in high-pressure metallic phases of Si." Physical review letters 54.21 (May 27, 1985): 2375-2378.
De, Amrit, et al. "Electronic structure and optical properties of Si, Ge and diamond in the lonsdaleite phase." Journal of Physics: Condensed Matter 26.4 (Jan. 8, 2014): 045801.
Algra, Rienk E., et al. "Twinning superlattices in indium phosphide nanowires." Nature 456.7220 (Nov. 20, 2008): 369-372.
Amato, Michele, et al. "Crystal phase effects in Si nanowire polytypes and their homojunctions." Nano letters 16.9 (Aug. 18, 2016): 5694-5700.
Fabbri, Filippo, et al. "Visible and infra-red light emission in boron-doped wurtzite silicon nanowires." Scientific reports 4.1 (Jan. 8, 2014): 3603.
Yin, M. T., et al. "Theory of lattice-dynamical properties of solids: Application to Si and Ge." Physical Review B 26.6 (Sep. 15, 1982): 3259.

(56) References Cited

OTHER PUBLICATIONS

Besson, J. M., et al. "Electrical properties of semimetallic silicon III and semiconductive silicon IV at ambient pressure." Physical Review Letters 59.4 (Jul. 27, 1987): 473.
Fabbri, Filippo, et al. "Preparing the way for doping wurtzite silicon nanowires while retaining the phase." Nano letters 13.12 (Nov. 13, 2013): 5900-5906.
Kurbatov, Andrei V., et al. "Discovery of a nanodiamond-rich layer in the Greenland ice sheet." Journal of Glaciology 56.199 (Dec. 2010): 747-757.
Nakaya, Ukichiro. Snow crystal, natural and artificial. Harvard University Press, (Jan. 1, 1954), Book brief information only.
Magono, Choji, et al. "Meteorological classification of natural snow crystals." Journal of the Faculty of Science, Hokkaido University. Series 7, Geophysics 2.4 (Nov. 1966): 321-335.
Storelvmo, Trude, et al. "The Wegener-Bergeron-Findeisen process—Its discovery and vital importance for weather and climate." Meteorologische Zeitschrift 24.4 (Apr. 13, 2015): 455-461.
Yang, C. C., et al. "Temperature-pressure phase diagram of silicon determined by Clapeyron equation." Solid state communications 129.7 (Feb. 2004): 437-441.
Lopez, Francisco J., et al. "Silicon nanowire polytypes: identification by Raman spectroscopy, generation mechanism, and misfit strain in homostructures." Acs Nano 5.11 (Oct. 21, 2011): 8958-8966.
Du, Xiaofan, et al. "The in-situ synthesis and strengthening mechanism of the multi-scale SiC particles in Al—Si—C alloys." Journal of Alloys and Compounds 750 (Apr. 3, 2018): 935-944.
Brauer, G., et al. "Characterization of a SiC/SiC composite by X-ray diffraction, atomic force microscopy and positron spectroscopies." Applied surface science 252.9 Oct. 21, 2006): 3342-3351.
Li, J., J. Y. Lin, and H. X. Jiang. "Surfactant effects of gallium on quality of AlN epilayers grown via metal-organic chemical-vapour deposition on SiC substrates." Journal of Physics D: Applied Physics 45.28 (Jun. 28, 2012): 285103.
Khiangte, Krista R., et al. "Molecular beam epitaxy and defect structure of Ge (111)/epi-Gd2O3 (111)/Si (111) heterostructures." Journal of Applied Physics 124.6 (Aug. 14, 2018): 065704.
Roest, Aarnoud L., et al. "Position-controlled epitaxial III-V nanowires on silicon." Nanotechnology 17.11 (May 19, 2006): S271.
Bakkers, Erik Pam, et al. "Epitaxial growth of InP nanowires on germanium." Nature materials 3.11 (Oct. 10, 2004): 769-773.
Smith, Bennett E., et al. "Recovery of hexagonal Si-IV nanowires from extreme GPa pressure." Journal of Applied Physics 119.18 (May 12, 2016): 185902.
Rödl, C., et al. "Wurtzite silicon as a potential absorber in photovoltaics: Tailoring the optical absorption by applying strain." Physical Review B 92.4 (Jul. 20, 2015): 045207.
Thanh, Nguyen TK, et al. "Mechanisms of nucleation and growth of nanoparticles in solution." Chemical reviews 114.15 (Jul. 8, 2014): 7610-7630.
Lamer, Victor K., et al. "Theory, production and mechanism of formation of monodispersed hydrosols." Journal of the american chemical society 72.11 (Nov. 17, 1950): 4847-4854.
Whitehead, Christopher B., et al. ""Burst nucleation" vs autocatalytic, "burst" growth in near-monodisperse particle-formation reactions." The Journal of Physical Chemistry C 124.45 (Oct. 29, 2020): 24543-24554.
M Awwad, Akl, et al. "Noval approach for synthesis sulfur (S-NPs) nanoparticles using Albizia julibrissin fruits extract." Advanced Materials Letters 6.5 (2015): 432-435. Accepted: Mar. 3, 2015.
Deshpande, Aniruddha S., et al. "Sulfur nanoparticles synthesis and characterization from H 2 S gas, using novel biodegradable iron chelates in W/O microemulsion." Nanoscale Research Letters 3 (Jul. 3, 2008): 221-229.
Radhika, G., et al. "Synthesis and electrochemical performance of PEG-MnO2-sulfur composites cathode materials for lithium-sulfur batteries." Journal of Nanoscience and Nanotechnology 18.1 (Jan. 1, 2018): 127-131.
Wen, John Z., et al. "Characterization of thermochemical properties of Al nanoparticle and NiO nanowire composites." Nanoscale research letters 8 (Apr. 20, 2013): 1-9.
Cava, Sérgio, et al. "Structural characterization of phase transition of Al2O3 nanopowders obtained by polymeric precursor method." Materials chemistry and physics 103.2-3 (2007): 394-399. Available online on Feb. 25, 2007.
Krause, B., et al. "Characterization of aluminum, aluminum oxide and titanium dioxide nanomaterials using a combination of methods for particle surface and size analysis." Rsc Advances 8.26 (Apr. 17, 2018): 14377-14388.
Zhang, Hailong, Ling Quan, and Lianghua Xu. "Effects of amino-functionalized carbon nanotubes on the crystal structure and thermal properties of polyacrylonitrile homopolymer microspheres." Polymers 9.8 (Aug. 2, 2017): 332.

\* cited by examiner

APPARATUS AND METHOD FOR MANUFACTURING HEXAGONAL CRYSTALS

CROSS-REFERENCE TO RELATED APPLICATION

This application claims priority to and the benefit of Korean Patent Application No. 10-2022-0022928 filed in the Korean Intellectual Property Office on Feb. 22, 2022, and Korean Patent Application No. 10-2022-0078260 filed in the Korean Intellectual Property Office on Jun. 27, 2022, the entire contents of which are incorporated herein by reference.

BACKGROUND OF THE INVENTION

(a) Field of the Invention

The present invention relates to an apparatus and a method for manufacturing a hexagonal crystal, and more particularly to an apparatus and a method for manufacturing hexagonal crystals using Al-based nano-absorbers in a mixed-source hydride vapor phase epitaxy (HVPE) method.

(b) Description of the Related Art

Hexagonal crystals include hexagonal silicon crystals, graphite, silicon carbide (SiC), germanium, $Ga_2O_3$, and so forth. However, only nano-sized hexagonal crystals have been grown until now. Any method for growing hexagonal crystals of a micro-size or more has not been reported yet.

Meanwhile, silicon of a cubic single crystal, which is widely used as a general material for a semiconductor, is a cheap and environmentally-friendly material. However, it has been limitedly applied to electro-optical areas because of cubic structural characteristics. That is, cubic silicon of an Oh7 (Fd3m) space group in a face-centered-cubic (FCC) lattice has a diamond structure which is an indirect band gap semiconductor with a maximum value of a valence band at the point Γ, a direct bandgap of 3.4 eV at the point G in the conduction band, and an energy of 2.0 eV at the point L. However, cubic silicon has an indirect band gap (X-valley) of 1.12 eV and a minimum value of a conductive band at the point X, which means it is very inefficient at absorbing light emission.

Hexagonal silicon is an allotrope of cubic silicon, but is capable of overcoming the limitation according to the above properties of cubic silicon to be applied to various applications. For example, a high pressure-resistant device may be implemented by using hexagonal single crystal silicon due to its strong physical properties. Hexagonal single crystal silicon is expected to be substituted for conventional materials such as SiC, GaN, and so forth in power devices, and electrode materials of a rechargeable battery while exerting improved performances. Furthermore, the crystal structure of the hexagonal single crystal silicon is modified to have a quasi-direct transition of energy band gap, which results in light emitting characteristics having various applications in various fields.

Nonetheless, growth of hexagonal silicon crystals requires very high pressure of about several tens of GPa at present, which is an obstacle to commercial use of hexagonal silicon crystals.

Germanium (Ge) crystals and SiGe alloys are sorts of cubic crystals and semiconductors having indirect band gaps which are not capable of emitting light efficiently. The goal of achieving efficient light emission of the group IV materials in silicon technology has been elusive for decades. Elham M. T. Fadaly et al. have recently achieved efficient light emission from hexagonal Ge crystals and SiGe alloys of direct band gaps, but this is limited to nano-sized crystals. Accordingly, it is desirable to grow bulk crystals over micro-sized hexagonal Ge crystals and hexagonal SiGe alloys. While the direct band gaps of hexagonal crystals are maintained, the wavelengths of the emitted light are gradually controllable in wide ranges to obtain an ideal material system, in which electric and electro-optical functions are implemented in a single chip, which is capable of applying to integrated devices and information process technologies.

Furthermore, silicon carbide (SiC) has become one of significant industrial materials for its excellent characteristics. Particularly, 4H—SiC has been a serious competitor to Si in the field of power semiconductors and is widely used in commercially available devices. A combination of Si and 4H—SiC as a new material has many potential applications in heterojunction diodes, bipolar junction transistors, and optoelectronics. However, since the lattice mismatch between Si and 4H—SiC is about 20%, it is very difficult to grow crystalline Si on 4H—SiC.

REFERENCES

[1] Larkin D J, Neudeck P G, Powell J A and Matus L G 1994 Site-Competition Epitaxy for Controlled Doping of CVD Silicon Carbide. Institute of physics Conf. series 137: SiC and related materials 51-54.
[2] Larkin D J, Neudeck P G, Powell J A and Matus L G 1994 Site-competition epitaxy for superior silicon carbide electronics. Appl. Phys. Lett. 65, 1659-1661.
[3] Neudeck P G, Larkin D J, Starr J E, Powell J A, Salupo C S and Matus L G 1993 Greatly improved 3C—SiC p-n junction diodes grown by chemical vapor deposition. IEEE Electron Device Lett. 14, 136-139.
[4] Marcus R A 1964 Chemical and Electrochemical Electron-Transfer Theory. Annual Review of Physical Chemistry 15, 155-196.
[5] Snyman L W, Plessis M du, Seevinck E and Aharoni H 1999 An efficient low voltage, high frequency silicon CMOS light emitting device and electro-optical interface. IEEE Electron Device Lett. 20, 614-617.
[6] Duttagupta S P, Peng C, Peng P M, Kurinec S K and Blanton T N 1995 Enhancement and suppression of the formation of porous silicon. J. Vac. Sci. Technol. B 13, 1230-1235.
[7] Hirschman K D, Tsybeskov L, Duttagupta S P and Fauchet P M 1996 Silicon-based visible light-emitting devices integrated into microelectronic circuits. Nature 384, 338-341.
[8] X. She, A. Q. Huang, O. Lucia, B. Ozpineci, IEEE Trans. Ind. Electron. 64 8193 2017.
[9] Raya-Moreno M., Aramberri, H., Seijas-Bellido, J. A., Cartoixa, X., & Rurali, R. Thermal conductivity of hexagonal Si and hexagonal Si nanowires from first-principles. Appl. Phys. Lett. 111, 032107 1-5 2017.
[10] Piltz, R. O., Maclean, J. R., Clark, S. J., Ackland, G. J., Hatton, P. D., & Crain, J. Structure and properties of silicon XII: A complex tetrahedrally bonded phase, Phys. Rev. B 52 4072-4085 1995.
[11] Blanco, A., Chomski, E., Grabtchak, S., Ibisate, M., John, S., Leonard, S. W., Lopez, C., Meseguer, F., Miguez, H., Mondia, J. P., Ozin, G. A., Toader, O., & van Driel, H. M. Large-scale synthesis of a silicon photonic crystal with a complete three-dimensional bandgap near 1.5 micrometres, Nature 405, 437-440 2000.

[12] Olijnyk, H., Sikka, S., & Holzapfel, W. Structural phase transitions in Si and Ge under pressures up to 50 GPa, Phys. Lett. A 103, 137-140 1984.

[13] Shin, N., Chi, M., Howe, J. Y. & Filler, M. A. Rational defect introduction in silicon nanowires, Nano Lett. 13, 1 928-1 933 2013.

[14] Hauge, H. I. T., Verheijen, M. A., Conesa-Boj, S., Etzelstorfer, T., Watzinger, M., Kriegner, D., Zardo, I., Fasolato, C., Capitan, F., Postorino, P., Kolling, S., Li, A., Assali, S., Stang, J., & Bakkers, E. P. A. M. Hexagonal Silicon Realized, Nano Lett. 15, 5855-5860 2015.

[15] Guo, Y., Wang, Q., Kawazoe, Y., & Jena, P. A new silicon phase with direct band gap and novel optoelectronic properties, Sci. Rep. 5, 14342 1-7 2015.

[16] Raffy, C., Furthmuller, J., & Bechstedt, F. Properties of hexagonal polytypes of group-IV elements from first-principles calculations, Phys. Rev. B 66, 075201 1-10 2002.

[17] Joannopoulos, J. D., & Cohen, M. L. Electronic properties of complex crystalline and amorphous phases of Ge and Si. I. density of states and band structures, Phys. Rev. B 7, 2644-2657 1973.

[18] Chang, K. J., Dacorogna, M. M., Cohen, M. L., Mignot, J. M., Chouteau, G., & Martinez, G. Superconductivity in High-Pressure Metallic Phases of Si, Phys. Rev. Lett. 54, 2375-2378 1985.

[19] De, A. & Pryor, C. E. Electronic structure and optical properties of Si, Ge and diamond in the lonsdaleite phase, J. Phys.: Condens. Matter 26, 1-13 2014.

[20] Algra, R. E., Verheijen, M. A., Borgstrǫ̃Om, M. T., Feiner, L. F., Immink, G., van Enckevort, W. J., Vlieg, E., Bakkers, E. P. A. M. Twinning superlattices in indium phosphide nanowires, Nature 456, 7220 369-372 2008.

[21] Amato, M., Kaewmaraya, T., Zobelli, A., Palummo, M., & Rurali, R. Crystal Phase Effects in Si Nanowire Polytypes and Their Homojunctions, Nano Lett. 16, 5694-5700 2016.

[22] Fabbri, F., Rotunno, E., Lazzarini, L., Fukata, N., & Salviati, G. Visible and infra-red light emission in boron-doped wurtzite silicon nanowires, Sci. Rep. 4, 3603, 1-7 2014.

[23] Yin, M. T., & Cohen, M. L. Theory of lattice-dynamical properties of solids: Application to Si and Ge application to Si and Ge, Phys. Rev. B 26, 3259-3272 1982.

[24] Besson, J. M., Mokhtari, H., Gonzalez, J., & Weill, G. Electrical properties of semimetallic silicon III and semiconductive silicon IV at ambient pressure, Phys. Rev. 473-476 1987.

[25] Fabbri, F., Rotunno, E., Lazzarini, L., Cavalcoli, D., Moldaldini, A., Fukata, N., Sato, K., Salviati, G., & Cavallini, A. Preparing the way for doping wurtzite silicon nanowires while retaining the phase, Nano Lett. 13, 5900-5906 2013.

[26] Kobayashi T et al. "Design and formation of SiC 0001/SiO2 interfaces via Si deposition followed by low-temperature oxidation and high-temperature nitridation". Applied Physics Express. 2020 Aug. 14.

[27] Elham M. T. Fadaly, Alain Dijkstra, Jens R. Suckert, Dorian Ziss, Marvin A. J. v. Tilburg, Chenyang Mao, Yizhen Ren, Victor T. v. Lange, Sebastian Kölling, Marcel A. Verheijen, David Busse, Claudia Rödl, Jürgen Furthmüller, Friedhem Bechstedt, Julian Stangl, Johnathan J. Finley, Silvana Botti, Jos E. M. Haverkort, Erik P. A. M. Bakkers, "Direct Bandgap Emission from Hexagonal Ge and SiGe Alloys", Nature volume 580, pages 205-209 2020.

[28] Claudia Rodl, Juorgen FurthmÜller, Jens Rene Suckert, Valerio Armuzza, Friedhelm Bechstedt, and Silvana Botti, "Accurate electronic and optical properties of hexagonal germanium for optoelectronic applications", Phys. Rev. Materials 3, 034602 2019.

[29] E. M. T. Fadaly et al., "Direct-bandgap emission from hexagonal Ge and SiGe alloys" Nature 580, 205-209 2020.

The above information disclosed in this Background section is only for enhancement of understanding of the background of the invention, and therefore it may contain information that does not form the prior art that is already known in this country to a person of ordinary skill in the art.

SUMMARY OF THE INVENTION

The present invention has been made in an effort to provide an apparatus and a method for manufacturing hexagonal crystals in bulk using Al-based nano-absorbers, wherein a hexagonal crystal includes hexagonal silicon crystals, hexagonal carbon crystals, SiC crystals, hexagonal Ge crystals, hexagonal $Si_{1-x}Ge_x$ crystals (0.35<x<1), and hexagonal $Ga_2O_3$ crystals.

It is another object of the present invention to provide an apparatus and a method for manufacturing a hexagonal crystal in a stable state on a highly lattice-mismatched substrate at room temperature and normal pressure, using an Al-based nano-absorber, wherein the substrate is selected from a group including graphite, silicon carbide, silicon, sapphire, quartz, ceramic, GaN, GaAs, InP, and $Ga_2O_3$.

It is still another object of the present invention to provide an apparatus and a method for manufacturing a hexagonal silicon crystal having a (002) plane on a 4H—SiC substrate, using Al-based nano-absorbers.

It is still another object of the present invention to provide an apparatus and a method for manufacturing a hexagonal crystal with a large area.

REFERENCES

[30] Kurbatov A V et al 2010 Discovery of a nanodiamond-rich layer in the Greenland ice sheet. J. Glaciol. 56, 747-757.

[31] Nakaya U 1954 Snow Crystal, natural and artificial. Harvard Univ. Press. 76.

[32] Magono C and Lee C W 1966 Meteorological Classification of Natural Snow Crystals. J. Fac. Sci., Hokkaido Univ., Ser. VII, 321-335

[33] Storelvmo T and Tan I 2015 The Wegener-Bergeron-Findeisen process—Its discovery and vital importance for weather and climate. Meteorol. Z. 24, 455-461.

[34] Olijnyk H, Sikka S and Holzapfel W 1984 Structural phase transitions in Si and Ge under pressures up to 50 GPa. Phys. Lett. A 103, 137-140.

[35] Du X, Gao T, Qian Z, Wu Y and Liu X 2018 The in-situ synthesis and strengthening mechanism of the multi-scale SiC particles in Al—Si—C alloys. J. Alloys Compd. 750, 935-944.

[36] Brauer G, Anwand W, Eichhorn F, Skorupa W, Hofer C, Teichert C, Kuriplach J, Cizek J, Prochazka I, Coleman P G, Nozawa T and Kohyama A 2006 Characterization of a SiC/SiC composite by X-ray diffraction, atomic force microscopy and positron spectroscopies. Appl. Surf. Sci. 252, 3342-3351.

[37] Al Tahtamouni T M, Li J, Lin J Y and Jiang H X 2012 Surfactant effects of gallium on quality of AlN epilayers grown via metal-organic chemical-vapour deposition on SiC substrates. J. Phys. D: Appl. Phys. 45, 285103 1-4.

[38] Khiangte K R, Rathore J S, Das S, Pokharia R S, Schmidt J, Osten H J, Laha A and Mahapatra S 2018 Molecular beam epitaxy and defect structure of Ge 111/ epi-Ga2O3 111/Si 111 heterostructures. J. Appl. Phys. 124, 065704 1-8.

[39] Bakkers E P A M, Van Dam J A, De Franceschi S, Kouwenhoven L P, Kaiser M, Verheijen M, Wondergem H and Sluis P V D 2004 Epitaxial growth of InP nanowires on germanium. Nat. Mater. 3, 769-773.

[40] LaMer V K, Dinegar R H 1950 Theory, Production and Mechanism of Formation of Monodispersed Hydrosols. J. Am. Chem. Soc. 72, 4847-4854.

[41] Whitehead C B, Watzky M A and Finke R G 2020 Burst Nucleation" vs Autocatalytic, "Burst" Growth in Near-Monodisperse Particle-Formation Reactions. J. Phys. Chem. C 124, 24543-24554.

To achieve these and other objects, an aspect of the present invention provides an apparatus for manufacturing hexagonal crystals, including: a reaction tube; a reaction boat disposed on one side in the reaction tube; a halogenation reaction gas supply pipe for supplying a halogenation reaction gas to the reaction boat; a nitrification reaction gas supply pipe for supplying a nitrification reaction gas to the reaction boat; and a heater for heating the reaction tube. The reaction boat includes: a source part for receiving source materials; and a crystal growth part disposed beneath the source part and having a depressed growth mold of a predetermined shape. The source part includes: at least one penetration hole formed on a bottom surface; a first allocating area formed around the at least one penetration hole, for receiving aluminum; and a second allocating area formed around the first allocating area, for receiving a main material of the hexagonal crystal and gallium.

Preferably, the first allocating area is disposed higher than the second allocating area.

Preferably, the penetration hole has a shape of a funnel or step. A lower diameter of the penetration hole is smaller than an upper diameter of the of the penetration hole.

The source allocating part is engaged with the crystal growth part by an engagement holding member, or the weight of the source allocating part.

The crystal growth part has a single growth mold or a plurality of growth molds which are the same or different in shapes or sizes.

The main material is in solid state and selected from a group Si, C, Ge, and Ga. The hexagonal crystal grown using the main material can be hexagonal silicon crystals, hexagonal carbon crystals, SiC crystals, hexagonal Ge crystals, hexagonal $Si_{1-x}Ge_x$ crystals ($0.35<x<1$), or hexagonal $Ga_2O_3$ crystals.

A mass ratio of the main material: aluminum:gallium is 0.80-1.5:1.25:1.

Preferably, the heater heats the reaction tube in a temperature range of 900-1350° C.

A substrate is preferably disposed in the growth mold of the crystal growth part, and the substrate is selected from a group including graphite, silicon carbide, silicon, sapphire, quartz, ceramic, GaN, GaAs, InP, and $Ga_2O_3$. Therefore, the hexagonal crystals grow on the selected substrate.

Another aspect of the present invention provides a method for manufacturing hexagonal crystals, including the steps of: providing a source allocating part in a reaction tube; providing a crystal growth part therebeneath with a depressed growth mold as the source allocating part; and heating the reaction tube in a temperature range of 900-1350° C.

The step of providing a source allocating part in a reaction tube, includes: disposing aluminum in a first allocating area which is formed around at least one penetration hole on a bottom surface; and disposing a mixture of main material of the hexagonal crystal and gallium in a second allocating area which is formed around the first allocating area.

After the heating step, the method includes the steps of: supplying a halogenation reaction gas and a nitrification reaction gas to the source allocating part; generating chloride gas of the main material and gallium chloride gas by reacting the main material and gallium with the halogenation reaction gas, respectively; generating aluminum chloride gas by reacting aluminum with the halogenation reaction gas; generating Al-based nano-absorbers in the crystal growth part by reacting the generated chloride gas with the main material, gallium chloride gas, and aluminum chloride gas with the nitrification reaction gas; generating AlN nuclei by reacting the Al-based nano-absorbers with the nitrification reaction gas; generating nuclei of hexagonal crystals by reacting chloride gas of the main material with the nitrification reaction gas and then substituting the AlN nuclei with precursors of the main material; and growing hexagonal crystal around the generated nuclei.

The step of growing hexagonal crystals includes: growing hexagonal crystals having a shape of a needle; and growing hexagonal crystals having a shape of a snowflake.

The step of providing a crystal growth part includes providing a substrate in the growth mold of the crystal growth part. The substrate is preferably selected from a group including graphite, silicon carbide, silicon, sapphire, quartz, ceramic, GaN, GaAs, InP, and $Ga_2O_3$.

Preferably, a lower diameter of the penetration hole is smaller than an upper diameter of the of the penetration hole, so that flow rates of gases passing through the penetration hole increase to supply gases to the crystal growth part smoothly.

Accordingly, a pressure of 0.1-1 GPa is applied to the growth mold or the substrate due to the pressure difference between the inside and outside of the penetration hole.

Preferably, the first allocating area is disposed higher than the second allocating area, so that melted main material or melted gallium in the second allocating area is prevented from flowing into the penetration hole.

The hexagonal crystal grown according to the present invention includes hexagonal silicon crystals, hexagonal carbon crystals, SiC crystals, hexagonal Ge crystals, hexagonal $Si_{1-x}Ge_x$ crystals ($0.35<x<1$), and hexagonal $Ga_2O_3$ crystals.

According to the present invention, hexagonal crystals are grown using Al-based nano-absorbers in an HVPE method, in which main materials, gallium, and aluminum are placed on a source allocating part without further supplies. Accordingly, it is possible to grow hexagonal crystals in various shapes and sizes. It is possible to manufacture a hexagonal crystal epitaxy on a highly lattice-mismatched substrate according to the present invention.

The main material is selected from a group consisting of Si, C, Ge, and Ga. The hexagonal crystal grown using the main material can be hexagonal silicon crystals, hexagonal carbon crystals, SiC crystals, hexagonal Ge crystals, hexagonal $Si_{1-x}Ge_x$ crystals ($0.35<x<1$), or hexagonal $Ga_2O_3$ crystals. Hexagonal crystals have stable hexagonal crystal structures of various sizes and shapes at room temperature and atmospheric pressure.

The apparatus and method for manufacturing hexagonal crystals according to the present invention can grow hexagonal crystals by using Al-based nano-absorbers regardless of a substrate. The present invention has an advantage of improved economic feasibility, compared to a Czochralski method or a crystal pulling method according to conventional silicon bulk growth.

Alternatively, the present invention provides hexagonal silicon epitaxy grown on a SiC substrate, which is selected from the space group C46v-P63mc having hexagonal or Wurtzite crystal structure such as a-phase 4H—SiC (a=3.0730 Å, b=10.053 Å) and 6H—SiC (a=3.0730 Å, b=10.053 Å). The Si epitaxy on a SiC substrate is capable of applying to electronic devices to achieve low fabrication costs and to significantly improve thermal characteristics.

Particularly, the present invention provides pure hexagonal silicon crystals which can be applied to various silicon industries such as solar cells, solid rechargeable batteries, power semiconductors, optical devices, and monolithic silicon photonics OEICs in which optical devices and electronic devices are simultaneously integrated. One of the important characteristics that determine the efficiency of a solar cell is the difference between a direct band gap and an indirect band gap. The band gap of hexagonal silicon crystals is relatively small (~0.7 eV), compared to the band gap of cubic silicon (~2.5 eV) to widen the ranges of the absorption wavelength. Therefore, the efficiency of the solar cell can be increased by 10% or more using hexagonal silicon crystals. Hexagonal silicon crystals can be used as a material for light emitting devices. In addition, since direct transition light emission is possible, it can be applied to light emitting devices such as LEDs and LDs and light receiving devices such as photodiodes.

Moreover, hexagonal crystal grown according to the present invention can be applied to next-generation power semiconductor devices under severe environments such as in automobiles, aviation, and space. It is possible to simultaneously integrate optical devices and electronic devices made only of silicon to obtain monolithic Si photonics/OEICs, using silicon having the quasi-direct transition type 2H hexagonal diamond structure. The devices may be applied to new industries and technologies. The energy difference between the direct band gap and the indirect band gap is one of the important characteristics that determine the efficiency of a solar cell. Since cubic Si-based solar cells have a direct band gap of 3.5 eV and an indirect band gap of 1.12 eV, the difference is about 2.3 to 2.4 eV. In the case of Si with a quasi-direct transition type 2H hexagonal diamond structure, the difference between the indirect band gap of 0.64 eV and the direct band gap of 1.69 eV is about 1 eV. Therefore, since it can absorb a wide range of the IR and visible regions of sunlight, the efficiency of a solar cell is increased by 10% or more. Hexagonal silicon crystals can also be a good material for light emitting devices. In addition, hexagonal silicon crystals are very useful in existing silicon-related industries such as for electronic devices, since its thermal conductivity is 40 or lower than that of the cubic Si crystal. In the case of on which a semi-direct bandgap is grown, the thermal characteristics of power semiconductors such as Si-based MOSFETs/diodes/IGBTs in which Si epitaxial having a quasi-direct transition of energy band gap is grown on a SiC substrate have improved thermal characteristics of power semiconductors by 60% or more, to enhance efficiencies at high-temperature and high-pressure. It is possible to integrate a monolithic OEICs for diode-based DSP (Digital Signal Processing) and power devices. Currently, hybrid OEICs, in which a compound semiconductor-based light emitting device and a silicon-based signal processing IC are integrated, and monolithic OEIC power semiconductor modules in which several separate modules are combined, are available. The present invention may also apply to hybrid OEICs and monolithic OEIC power semiconductor modules.

In addition, hexagonal single crystals can be grown very stably at atmospheric pressure by using Al-based nano-absorbers according to the present invention. The use of Al-based nano-absorbers is capable of applying to the growth on other materials having a mismatched lattice such as by 20% or more, as well as to similar crystals such as Ge and C. This provides significant possibilities in the semiconductor field. For example, since the hexagonal crystals can be formed on a substrate of graphite, silicon carbide, silicon, sapphire, quartz, ceramic, GaN, GaAs, InP, or $Ga_2O_3$, it can be applied to various applications.

REFERENCES

[42] Yaguang Guo, Qian Wang, Yoshiyuki Kawazoe, and Puru Jena, "A New Silicon Phase with Direct Band Gap and Novel Optoelectronic Properties", Scientific Reports, 5, 14342 2015.
[43] Marti Raya-Moreno1, Hugo Aramberri, Juan Antonio, Seijas-Bellido, Xavier Cartoixal, and Riccardo Rurali, "Thermal conductivity of hexagonal Si and hexagonal Si nanowires from first-principles", Appl. Phys. Lett. 111, 032107 2017.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE EMBODIMENTS

Preferred embodiments of the present invention will hereinafter be described in detail with reference to the accompanying drawings, where like numerals of reference designate like elements throughout.

Figure 1:
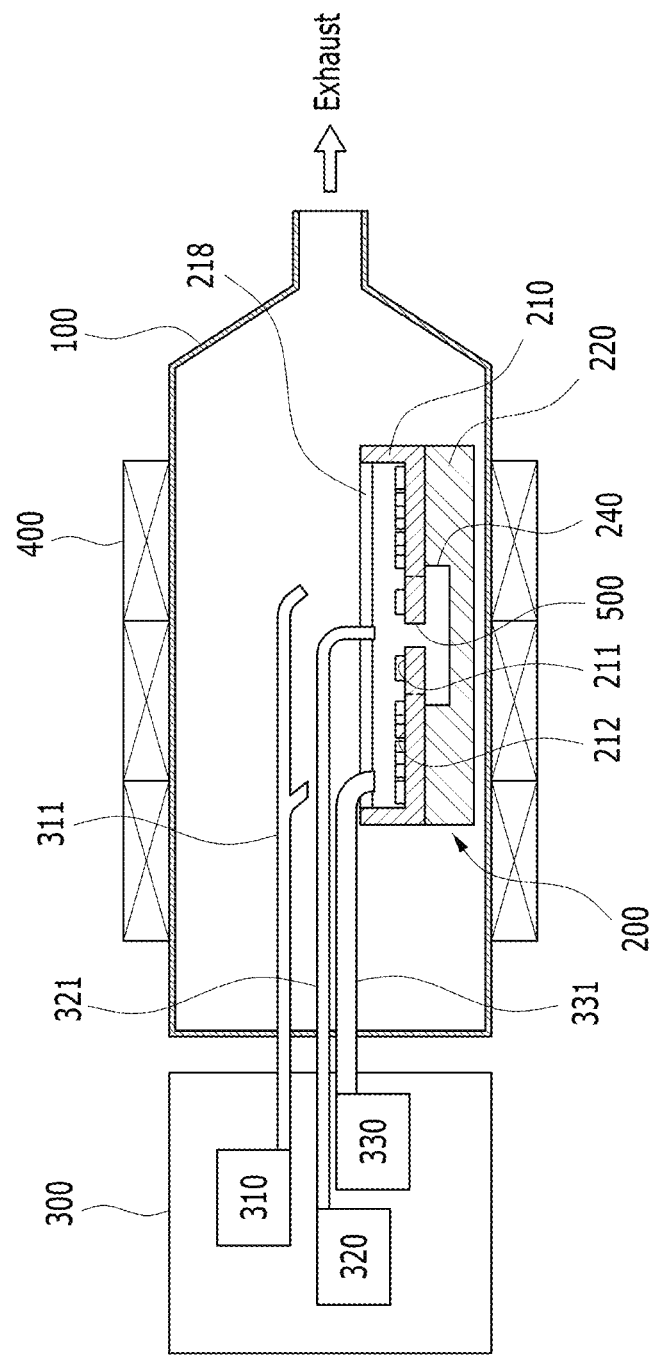
FIG. 1 shows an apparatus for manufacturing hexagonal crystals according to an embodiment of the present invention.

FIG. 1 shows an apparatus for manufacturing hexagonal crystals according to a first embodiment of the present invention.

The apparatus for manufacturing hexagonal crystal according to the present invention employs a HVPE method for growth of hexagonal crystals. Referring to FIG. 1, the apparatus includes a reaction tube 100, a reaction boat 200 disposed in the reaction tube 100, a gas supply 300 for supplying reaction gases to the reaction tube 100, and a heater 400 for heating the interior of the reaction tube 100.

The reaction tube 100 is preferably a quartz tube, and the heater 400 is preferably a hot wall furnace configured as a general three-heater furnace, but it is not limited thereto.

Figure 2:
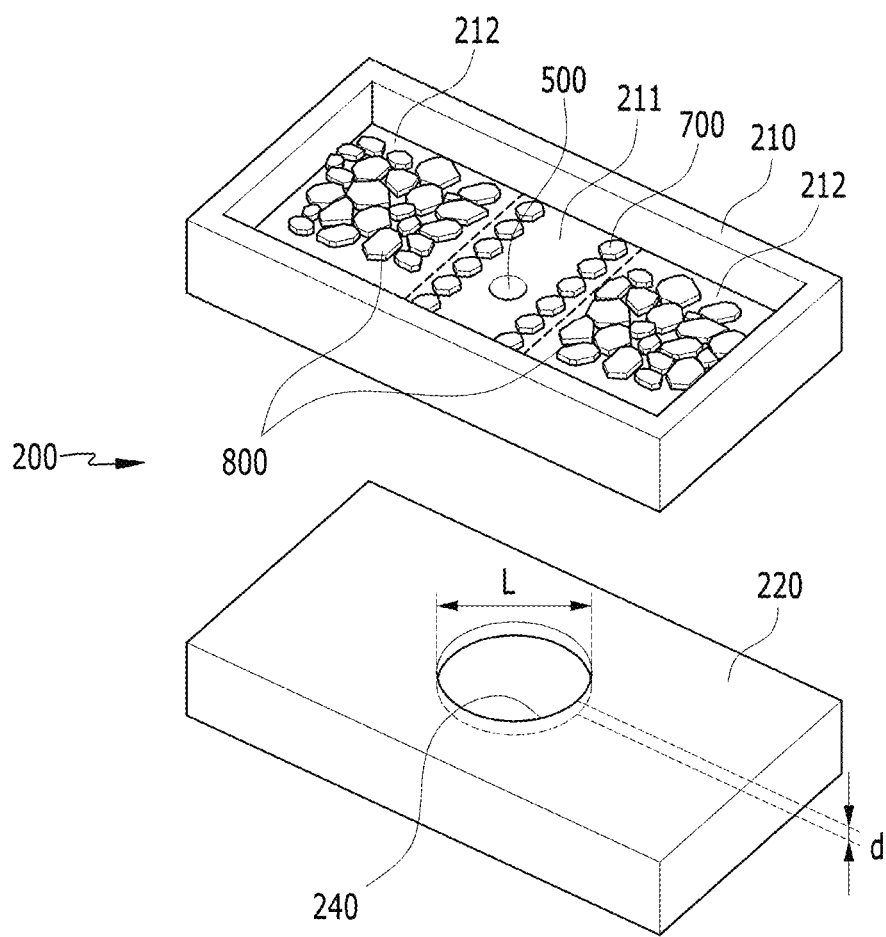
FIG. 2 shows an exploded perspective view of a reaction boat of FIG. 1 when which a cover is removed.

The reaction boat 200 is a module of which a source allocating part 210 and a crystal growth part 220 are connected. The source allocating part 210 and the crystal growth part 220 are arranged vertically. FIG. 2 shows an exploded perspective view of the reaction boat 200 of FIG. 1 when a cover 218 is removed.

The source allocating part 210 has a bottom surface in the shape of a rectangle, but it is not limited thereto. The shape may be circular or other shapes. The source allocating part 210 has one or more penetration holes 500 formed on the bottom surface, a first allocating area 211 disposed around the penetration hole 500, and the second allocating area 212 disposed around the first allocating area 211. That is, the first allocating area 211 is disposed closer to the penetration hole 500 than the second allocating area 212.

The first allocating area 211 receives aluminum 700 in a solid state, and the second allocating area 212 receives a mixture material 800 of the main material of the hexagonal crystals and gallium. The aluminum 700 in first allocating area 211 is placed without blocking the penetration hole 500.

Aluminum acts as a catalyst for nucleation required for growing hexagonal crystals. Gallium melts the main material of hexagonal crystals and then accommodates a reaction with the halogenation reaction gas as described later. Gallium also avoids oxidation of materials and then accommodates easy contact with the halogenation reaction gas. Gallium also acts as a catalyst for nucleation required for growing hexagonal Si crystals on the substrate, together with aluminum. Aluminum placed on the first allocating area 211 around the penetration hole 500 serves as a main source of nano-absorbers formation.

It is noted that aluminum 700 should be separated from gallium. That is, aluminum 700 is placed in the first allocating area 211, not in direct contact with gallium in order to prevent melted gallium from directly contacting with aluminum and melting all the aluminum. Rather, $GaCl_3$ in gas state acts on the aluminum metal surface to efficiently generate Al-based nano-absorbers.

The main material is in a solid state and is selected from a group consisting of Si, C, Ge, and Ga. One or more materials selected from the group of main materials are used to grow hexagonal crystals. When the hexagonal crystals are hexagonal Si crystals, hexagonal Ge crystals, or hexagonal carbon crystals, one main material among Si, Ge, and C is used. When the hexagonal crystals are SiC crystals, Si and C are used. In the case of hexagonal $Ga_2O_3$ crystals, Ga and O are selected as main materials. In the case of hexagonal $Si_{1-x}Ge_x$ crystals ($0.35<x<1$), Si and Ge are selected as main materials.

When hexagonal crystals are grown, a substrate may be used in a growth mold as described later. When hexagonal silicon crystals or hexagonal $Ga_2O_3$ crystals@@@ are grown on a substrate which is selected from a group of a SiC substrate, a sapphire substrate, or a GaN substrate, they serve as a material for semiconductors.

A mass ratio of the main material: aluminum:gallium is 0.80-1.5:1.25:1. That is, a ratio of aluminum to the main material ranges from 80%-150%.

FIG. 3A to FIG. 3D show several examples of the first allocating area 211 and the second allocating area 212 of the source allocating part 210.

Figure 3A:
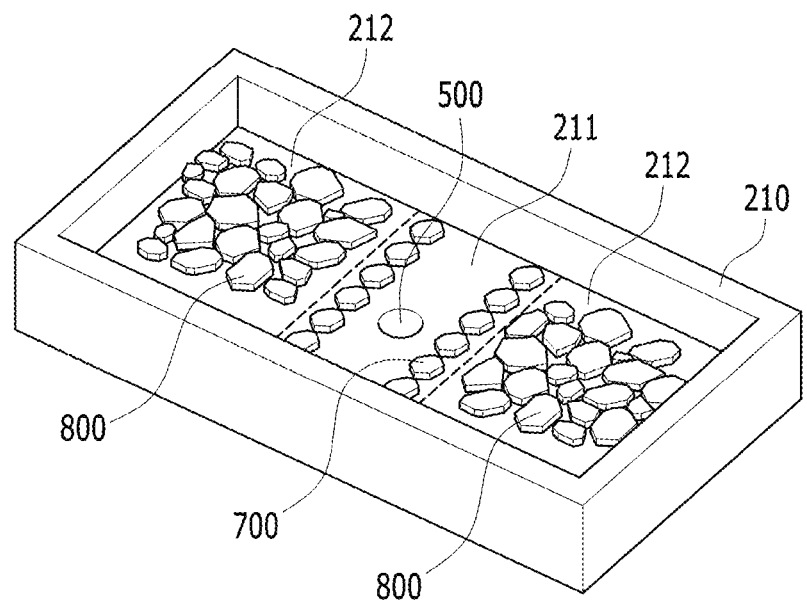
FIG. 3A-FIG. 3G show perspective views of a source allocating part as other examples.
Figure 3B:
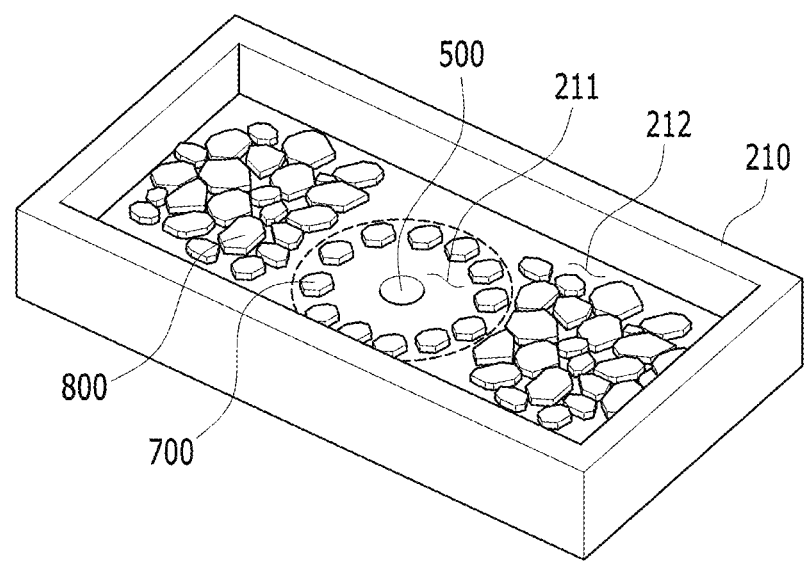
Figure 3C:
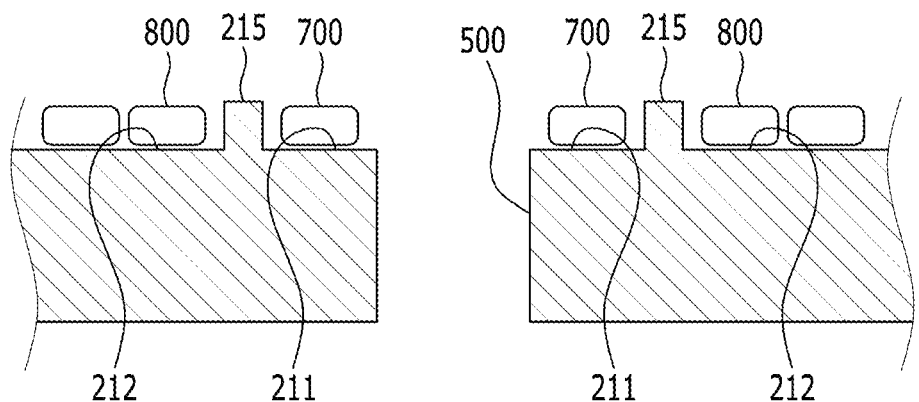

FIG. 3A shows that a rectangular first allocating area 211 is formed around a penetration hole 500, and FIG. 3B shows that a circular first allocating area 211 is formed around a penetration hole 500. The first allocating area 211 and the second allocating area 212 may be physically separated by a separation protrusion 215, as shown in FIG. 3C.

Figure 3D:
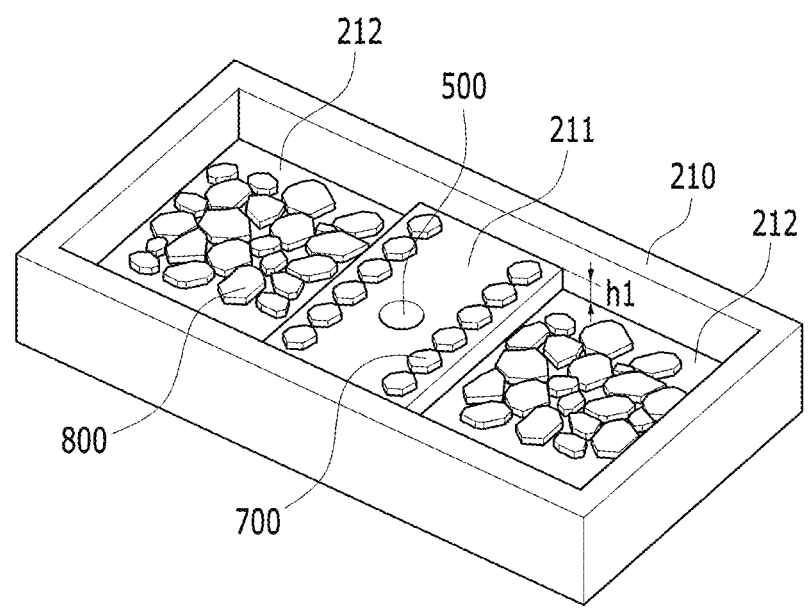
Figure 3E:
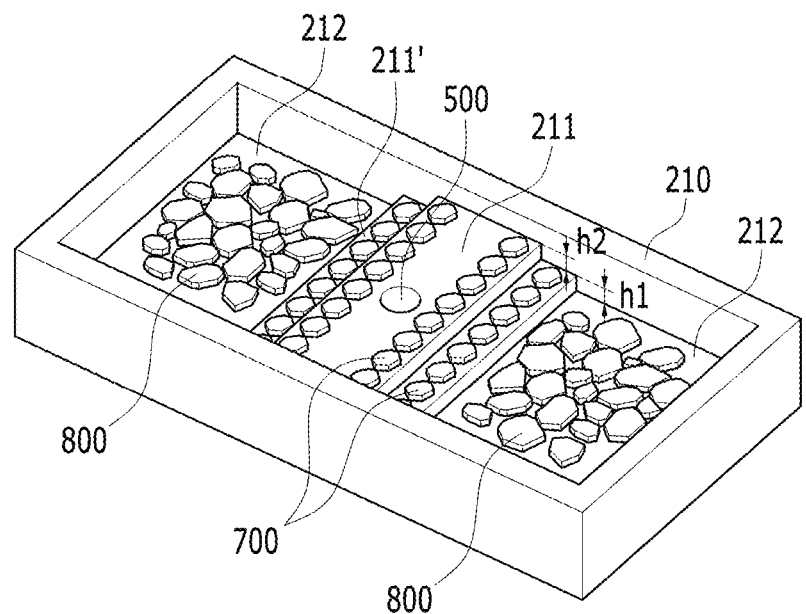
Figure 3F:
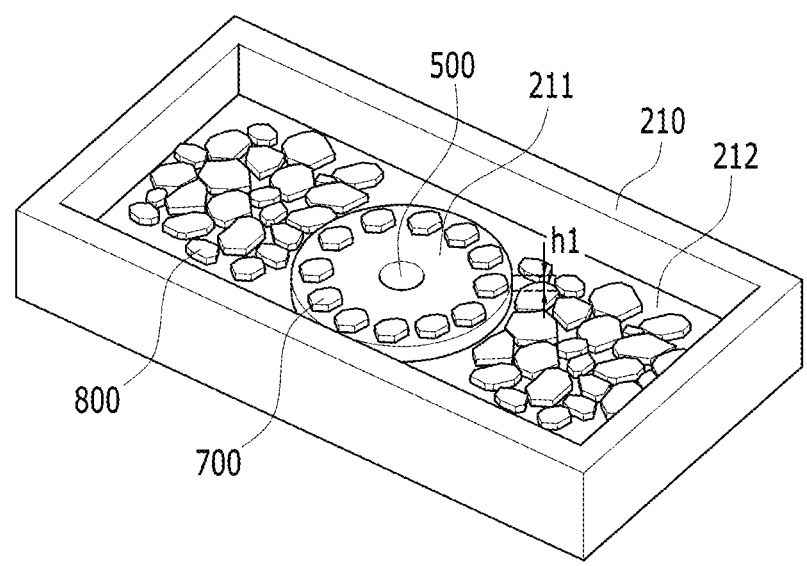

FIG. 3D and FIG. 3F show that a first allocating area 211 is disposed higher than a second allocating area 212 by a predetermined height. The first allocating area 211 having a rectangular shape is disposed with a predetermined height h1 from a bottom surface of the source allocating part 210, as shown in FIG. 3D. The first allocating area 211 of FIG. 3F differs from FIG. 3D in that the first allocating area 211 has a circular shape. The first allocating area 211 may have a separation protrusion around its edge as shown in FIG. 3C, although it is not shown.

Figure 3G:
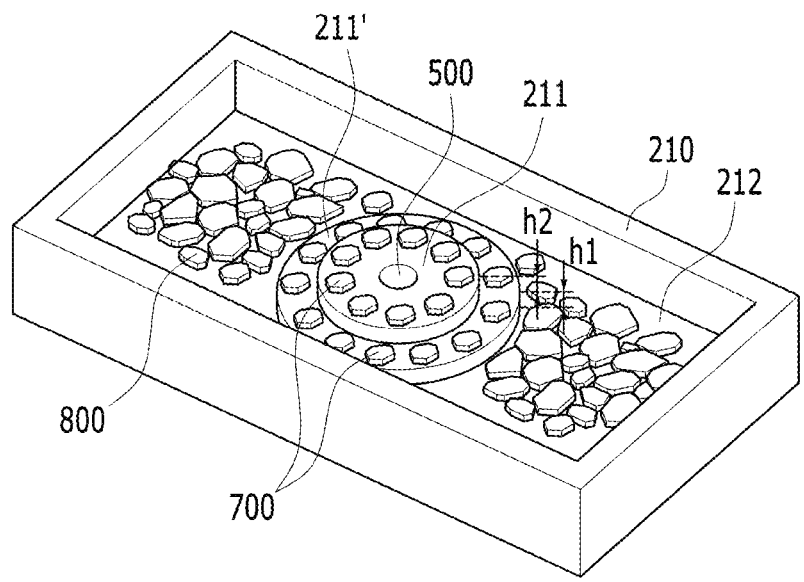

FIG. 3E and FIG. 3G show that the first allocating areas 211' and 211 are formed with two steps of heights, h1 and h2. The first allocating areas 211' and 211 having rectangular shapes are disposed with predetermined heights h2 and h2 from the bottom surfaces of the source allocating part 210 and the first allocating are 211, respectively, as shown in FIG. 3E. The first allocating areas 211' and 211 of FIG. 3G differ from FIG. 3E in that the first allocating areas 211' and 211 have circular shapes. Each of the heights h1 and h2 preferably ranges from 1 mm to 5 mm. Since the first allocating area 211 or 211 is disposed higher than the second allocating area 212, the melted main material or melted gallium in the second allocating area 212 is prevented from flowing into the penetration hole 500.

Figure 4A:
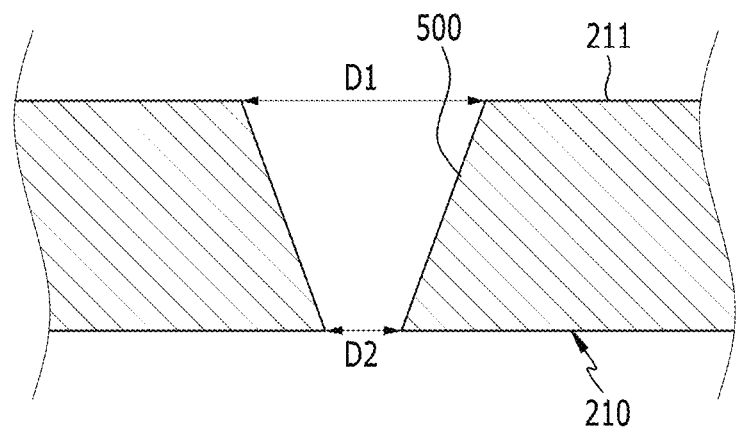
FIG. 4A-FIG. 4C show cross-sectional views of a penetration hole in a source allocating part.
Figure 4B:
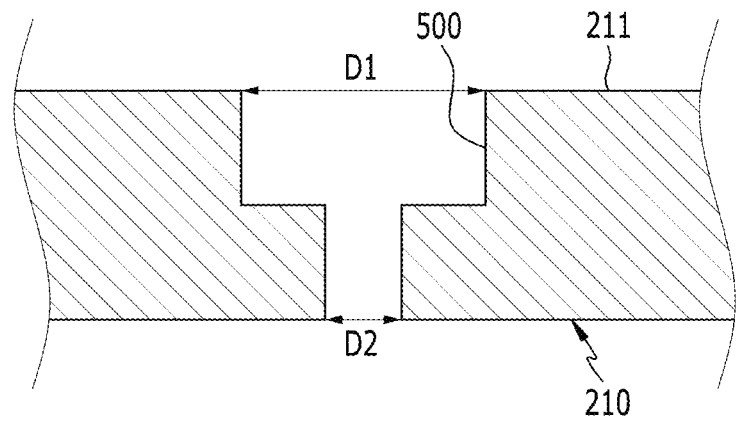
Figure 4C:
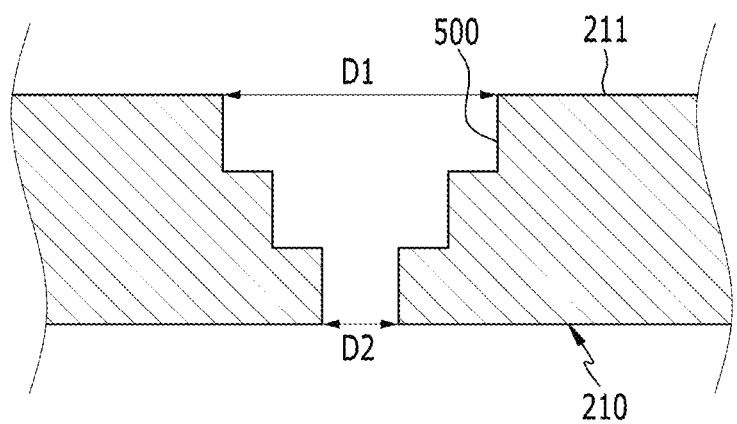

The penetration hole 500 is formed on a bottom surface of the source allocating part 210. Preferably, a lower diameter D2 of the penetration hole 500 is smaller than an upper diameter D1 of the penetration hole, so that flow rates of gases passing through the penetration hole increase. FIG. 4A shows a penetration hole 500 in the shape of a funnel, while FIG. 4B-FIG. 4C show a penetration hole 500 in a stepped shape, in which a lower diameter D2 of the penetration hole 500 is smaller than an upper diameter D1. The diameters D1 and D2 of the penetration hole 500 range from 5 mm to 10 mm, and the ratio of D1:D2 is in a range of about 1-2. As such, the lower diameter D2 of the penetration hole 500 is smaller than the upper diameter D1, so flow rates of gases passing through the penetration hole 500 increase to supply gases to the growth mold 240 of the crystal growth part 220 smoothly. The flow rate of gas is inversely proportional to a cross-section through which the gas flows. That is, the smaller an area, the faster a flow rate. Accordingly, gases at the lower point of the penetration hole 500 are faster, and then enter into the growth mold 240 smoothly. The stepped shapes of the first allocating area shown in FIGS. 4B-4C have an advantage of preventing melted liquids from directly falling into the growth mold 240.

Since the pressure differs at the inside of the penetration hole 500 from the outside of the penetration hole, a pressure of 0.1-1 GPa is applied to the growth mold 240 or a substrate in the growth mold.

Preferably, the source allocating part 210 is covered by a cover 218. The cover 218 has openings through which supply pipes 321 and 331 are positioned in the source allocating part 210, in order to supply reaction gases.

The crystal growth part 220 is disposed beneath the source allocating part 210 and has a rectangular bottom similar to that of the source allocating part 210, but is not limited thereto. The crystal growth part 220 has a depressed growth mold 240 of a predetermined shape which defines the grown shape of hexagonal crystals. For example, the growth mold 240 has a depressed circular cylindrical shape or a depressed rectangular cylinder shape, but is not limited thereto. A diameter L (or a length of a side L) or a depth d of the growth mold 240 shown in FIG. 2 may be selected according to a desirable shape of hexagonal crystals grown. When the diameter L is selected to be large, it is preferable that the depth d is also selected to be large in proportion thereto. For example, the diameter is selected as 2 inches and 4 inches, the depth d is then selected as 500 μm and 1 mm or more, respectively.

It is preferably that the crystal growth part 220 including the growth mold 240 is made of graphite or graphite with a carbon coating. A substrate is not necessary for growing hexagonal crystals, but is preferably employed for manufacturing various semiconductors. A substrate may be selected from various substrates available for industrial use without considering a lattice mismatch of crystals.

For example, hexagonal silicon crystals are preferred to grow on a substrate which is selected from a group consisting of graphite, silicon carbide, silicon, sapphire, quartz, ceramic, and various commercially used substrates such as GaN, GaAs, InP, $Ga_2O_3$, etc. Alternatively, a substrate is preferably selected from a SiC substrate such as a space group C46v-P63mc, a-phase 4H—SiC (a=3.0730 Å, b=10.053 Å), and 6H—SiC (a=3.0730 Å, b=10.053 Å), which are Wurtzite crystalline structures. Particularly, when hexagonal silicon crystals grown on a SiC substrate (Si/SiC substrate) are employed for manufacturing an electronic device, it results in an advantage for enhancing thermal characteristics of power semiconductor devices such as Si-based MOSFETs, diodes, and IGBTs, thereby significantly improving efficiency at high temperature and high pressure.

Figure 5:
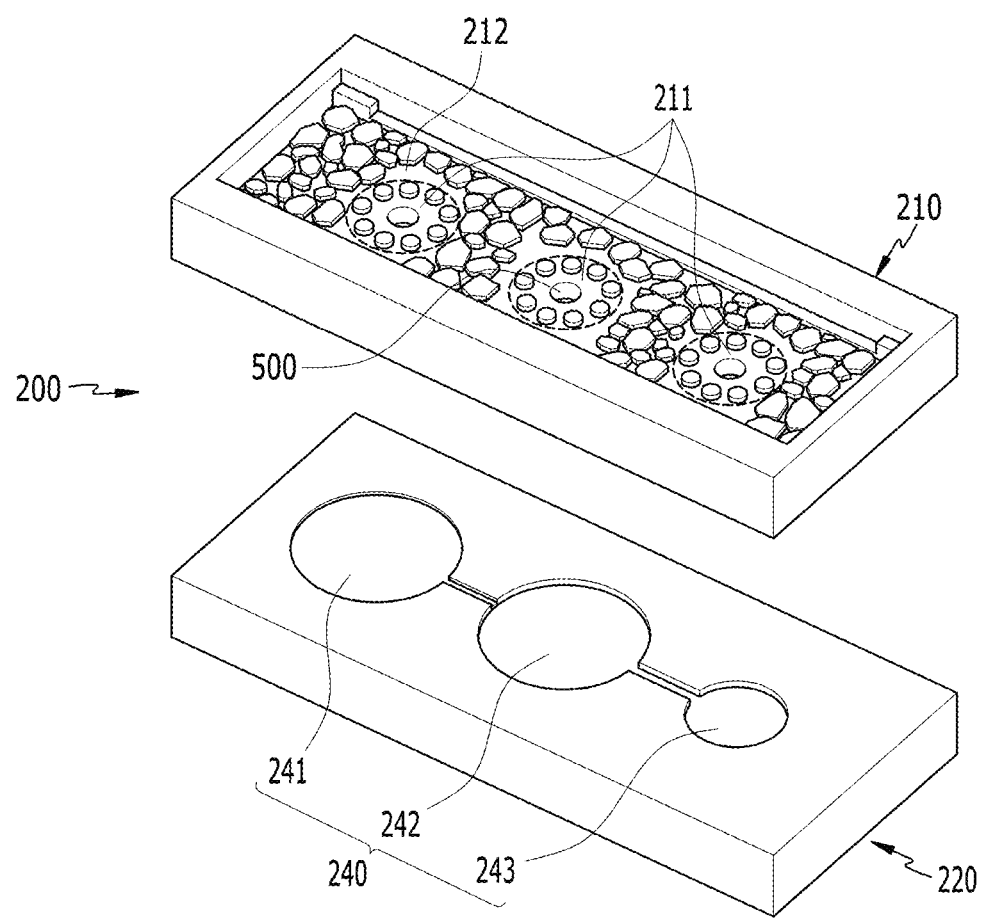
FIG. 5 shows an exploded perspective view of another example of a reaction boat when a cover is removed.

Although FIG. 2 shows a single growth mold 240 in the crystal growth part 220, it is possible to form two or more growth molds. FIG. 5 shows three growth molds 241, 242, and 243 in a crystal growth part 220. It is noted that three growth molds 241, 242, and 243 may have different diameters and depths. Therefore, a plurality of crystals in different shapes can be obtained from a single growing process. The three growth molds 241, 242, and 243 are in fluid communication with each other in order to maintain internal pressures at the same pressure as shown in FIG. 5. It also possible to form the growth molds isolated from each other, as necessary. In line with three growth molds 241, 242, and 243, a source allocating part 210 has three penetration holes 500 and three first allocating areas 211 around the holes. It is possible to further form penetration holes 500 as necessary.

Figure 6A:
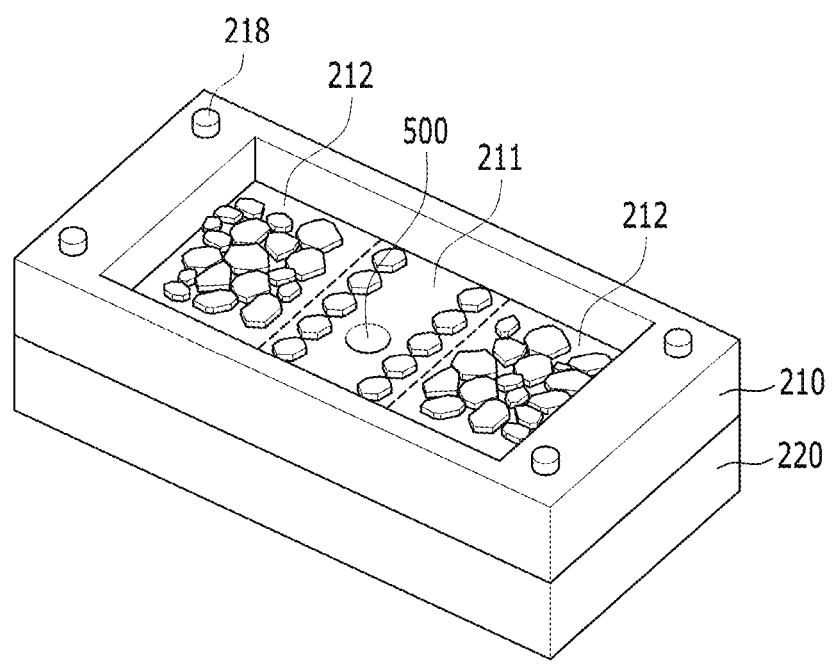
FIG. 6A shows another example of a reaction boat when graphite screws are used to engage a source allocating part with a crystal growth part.
Figure 6B:
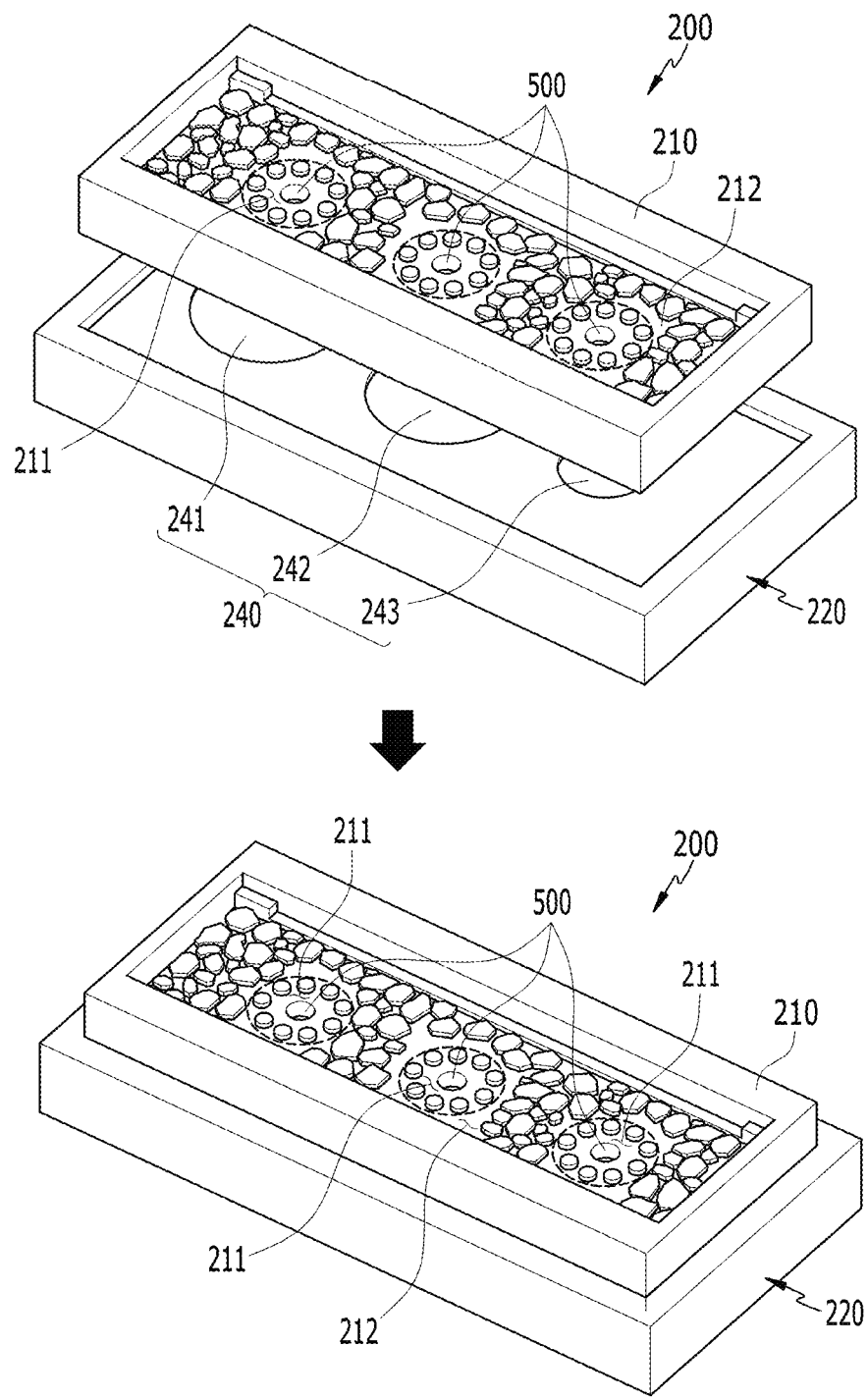
FIG. 6B shows another example of a reaction boat when a source allocating part is fitted to a crystal growth part.

The source allocating part 210 and the crystal growth part 220 are in close contact with each other without a gap, to maintain a predetermined pressure in the growth mold 240 of the growth mold 240 of the crystal growth part 220, as described later. The source allocating part 210 is engaged with the crystal growth part 220 by its own weight, fitting into the crystal growth part, or an engagement holding member, in order to be in close contact. FIG. 6A shows that graphite screws are employed as engagement holding members to engage the source allocating part 210 with the crystal growth part 220. FIG. 6B shows that the source allocating part 210 is fitted into the crystal growth part 220 without any engagement holding member. Alternatively, it is possible to engage a source allocating part with a crystal growth part using a clamp.

The gas supply 300 includes an atmosphere gas supply 310 for supplying an atmosphere gas such as nitrogen, a nitrification reaction gas supply 320 for supplying a nitrification reaction gas such as ammonia (NH$_3$), and a halogenation reaction gas supply 330 for supplying a halogenation reaction gas such as hydrogen chloride (HCl). The gas supplies 310, 320, and 330 supply gases to the reaction tube 100 via pipes 311, 321, and 331, respectively.

The atmosphere gas supply 310 provides atmospheric gas, e.g., nitrogen, via the pipe 311, to form nitrogen as an atmospheric environment in the reaction tube 100 and the reaction boat 200. Although FIG. 1 shows that the atmosphere gas supply pipe 311 is disposed outside the reaction boat 200, atmosphere gas may be directly supplied into the reaction boat 200, as necessary. This makes the atmosphere gas directly carry chloride gas of the main material and metal chloride gases (AlCl$_n$ and GaCl$_n$) which are generated by reaction of the main material, gallium, and aluminum with a halogenation reaction gas to the crystal growth part 220 through the penetration hole 500. The atmospheric gas further maintains stable gas flow in the reaction tube 100.

The halogenation reaction gas is directly blown to aluminum disposed on the first allocating area 211 and main material and gallium disposed on the second allocating area 212 of the source allocating part 210 the pipe 331 connected to the halogenation reaction gas supply 330, and accommodates generating chloride gas of the main material and metal chloride gases (AlCl$_n$ and GaCl$_n$).

The pipe 321 connected to the nitrification reaction gas supply 320 provides the crystal growth part 220 through the penetration hole 500 with the nitrification reaction gas. Therefore, an outlet of the pipe 321 is preferably disposed around the penetration hole 500, but not limited thereto.

A method for manufacturing hexagonal crystal using the apparatus according to the present invention will now be described. For convenience of explanation, it will be described that the hexagonal crystal is a hexagonal silicon crystal with silicon as the main raw material.

First, aluminum 700, which is solid, is disposed on the first allocating area 211 of the source allocating part 210, without blocking the penetration hole 500. Solid silicon as main material is mixed with solid gallium to form a mixed source 800. The mixed source 800 are evenly disposed on the second allocating area 212. Silicon is main material for growing hexagonal silicon crystal and is metallurgical grade silicon. Aluminum acts as a catalyst for nucleation required for growing hexagonal Si crystal. Aluminum is placed on the first allocating area 211 around the penetration hole 500 serves as a main source of nano-absorbers formation. Gallium melts the main material of silicon and then accommodates a reaction with the halogenation reaction gas as described later. Gallium also avoids oxidation of materials and then accommodates easy contact with the halogenation reaction gas. Gallium also acts as a catalyst for nucleation required for growing hexagonal Si crystal on the substrate, together with aluminum.

The mixing ratio of silicon as main material: aluminum: gallium is 0.80-1.5:1.25:1. That is, a ratio of aluminum to main material ranges from 80%-150%.

The crystal growth part 220 is provided beneath the source allocating part 210. It is possible to use an engagement holding member to engage the source allocating part 210 with crystal growth part 220, as necessary.

Next, the heater 400 is operated to heat the reaction tube 100 to 1200-1350° C. At this time, an atmospheric gas of nitrogen is provided to flow and a nitrification reaction gas of ammonia is provided to flow a certain amount to the reaction boat 200 before heating to raise the temperature of the reaction boat 200. The pipe 321 for supplying the nitrification reaction gas is formed of a quartz tube Next, the temperature of the reaction tube 100 becomes stable and then a halogenation reaction gas of hydrogen chloride is provided to the source allocating part 210. The hydrogen chloride reacts with each of aluminum, silicon and gallium. The silicon reacts with hydrogen chloride to generate trichlorosilane (Si+3HCl→SiHCl$_3$+H$_2$), the aluminum reacts with hydrogen chloride to generate AlCl, and the gallium reacts with hydrogen chloride to generate GaCl$_n$ (n=1, 2, 3 . . . ).

At this time, gallium disperses the surfaces of aluminum and silicon in the mixed source and mostly removes the oxidized layer and the nitrified layer of the surfaces of aluminum and silicon. That is, silicon and aluminum are oxidized and nitrified in a high temperature atmosphere, but a small amount of gallium disperses from their surfaces and removes the oxidized layer and the nitrified layer to activate while raising the temperature. Therefore, gallium activates aluminum to accommodate reactions between aluminum and hydrogen chloride to generate AlCl. It is noted that AlCl gas which generated from the reaction of aluminum with hydrogen chloride flows into the penetration hole 500, and acts as a source of Al-based nano-absorbers in the growth mold 240 of the crystal growth part 220. Gallium further suppresses generation of an oxidized layer and a nitrified layer on the surface of silicon, and accommodates reactions between silicon and hydrogen chloride to generate trichlorosilane (SiHCl$_3$).

Next, SiHCl$_3$, AlCl, and GaCl$_n$ gases, which are generated from reactions between each material and hydrogen chloride, flow into the penetration hole 500, react with ammonia of the nitrification reaction gas and then form Al-based nano-absorbers which serve as nuclei for the hexagonal Si crystal on the surface of the growth mold 240 of the crystal growth part 220. Al-based nano-absorbers served as nuclei for hexagonal silicon crystal includes Al from AlCl gas, N from nitrification reaction gas, and O distributed in the reaction tube 100, and other atoms, and have nano-sizes. Adatoms grow on Al-based nano-absorbers and coexist with Si nuclei during early growth. A bond of Al and N is a material with a covalent bond having a Wurtzite structure or a hexagonal 2H structure. Accordingly, it is possible to rapidly grow Si nuclei with a pure hexagonal 2H structure. Trichlorosilane is provided to the depressed growth mold 240 of the crystal growth part 220 at the high partial pressure to grow hexagonal Si crystals in a main growth mode. In the present invention, only predetermined amounts of aluminum and gallium in a HVPE method, which differs from a conventional HVPE method or MOCVD in which source material, is continuously supplied. This causes aluminum and gallium in the source allocating part to be exhausted rapidly. In this condition, aluminum and gallium are depleted before Al-based nano-absorbers grow to another nano-crystal completely. Then the concentration of silicon rapidly increases as compared to that of aluminum, so that silicon atoms outcompete aluminum atoms. By this principle, the remaining dopants also can be excluded.

It is noted that predetermined amounts of aluminum and gallium are rapidly exhausted, and then aluminum atoms are substituted by silicon atoms by outcompeting according to the present invention which provides an optimized growth mechanism to hexagonal crystals. Within 10 minutes of growth time, this phenomenon occurs simultaneously, and a relatively excessive amount of SiCl$_n$ form absorbers such as Al+O+N+C+Si, which can be used to form hexagonal Si crystals.

Nuclei of silicon, which are included in the absorbers, can rapidly grow in a length direction (002) plane, but grow in the growth mold 240 of the crystal growth part 220 to form hexagonal silicon crystals. The pressure inside the growth mold 240 of the crystal growth part 220 can be obtained by engaging the source allocating part 210 with the crystal growth part 220 in vertical disposition.

Figure 7:
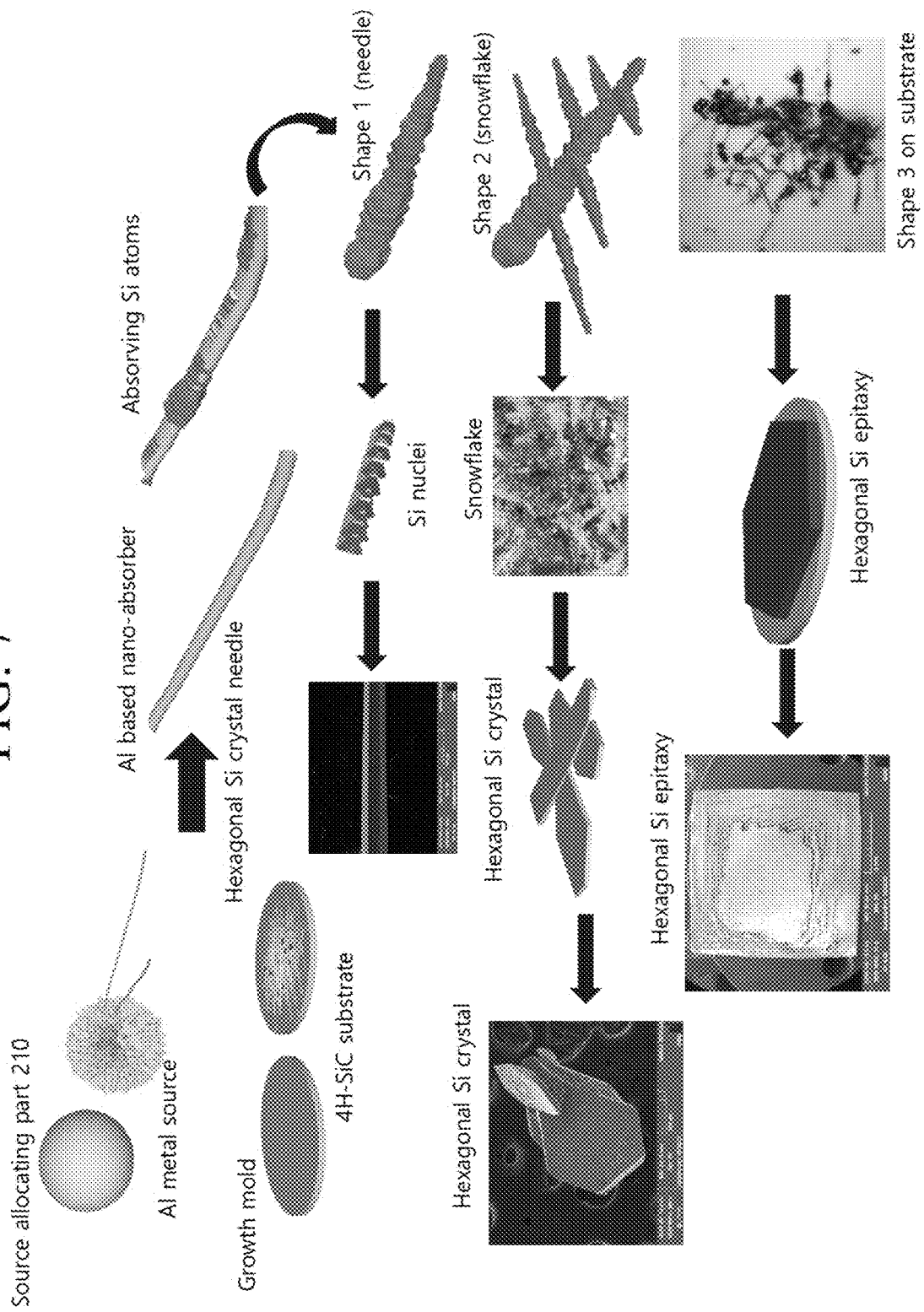
FIG. 7 shows a schematic view illustrating the growth mechanism of hexagonal crystals using Al-based nano-absorbers according to the present invention.

FIG. 7 shows a schematic view illustrating the growth mechanism of hexagonal crystals using Al-based nano-absorbers according to the present invention. Al metal forms Al-based nano-absorbers for growing hexagonal Si crystals. When the temperature is raised, Al metal reacts with HCl to generate protrusions on its surface. Then nano-nuclei are grown, and Al-based nano-absorbers are generated in the shape of multitudinous downy hairs.

At this time, N which belongs to Group V is provided from the reaction the nitrification reaction gas $NH_3$ with the metal chloride gas (AlCl and $GaCl_n$). Furthermore, since Si, Al, Ga, C, N, and O elements with AlCl are provided to Al-based nano-absorbers, Al-based nano-absorbers becomes large in the shape of a hexagonal micro-wire containing Si, Al, Ga, C, N, and O elements. This is a process in which the nuclei of AlN are generated. $SiHCl_3$, AlCl, and $GaCl_n$ react with ammonia gas to adsorb gallium, aluminum, carbon, etc. in the absorbers, and then the absorbers becomes AlN-based micro-clusters including C and O adsorption. The microclusters have hexagonal shapes close to a circle formed of a translucent nanomembrane. They have no intrinsic crystalline structure yet, and take the form of semi crystalline micro-needles in a structurally very weak shell.

Figure 32A:
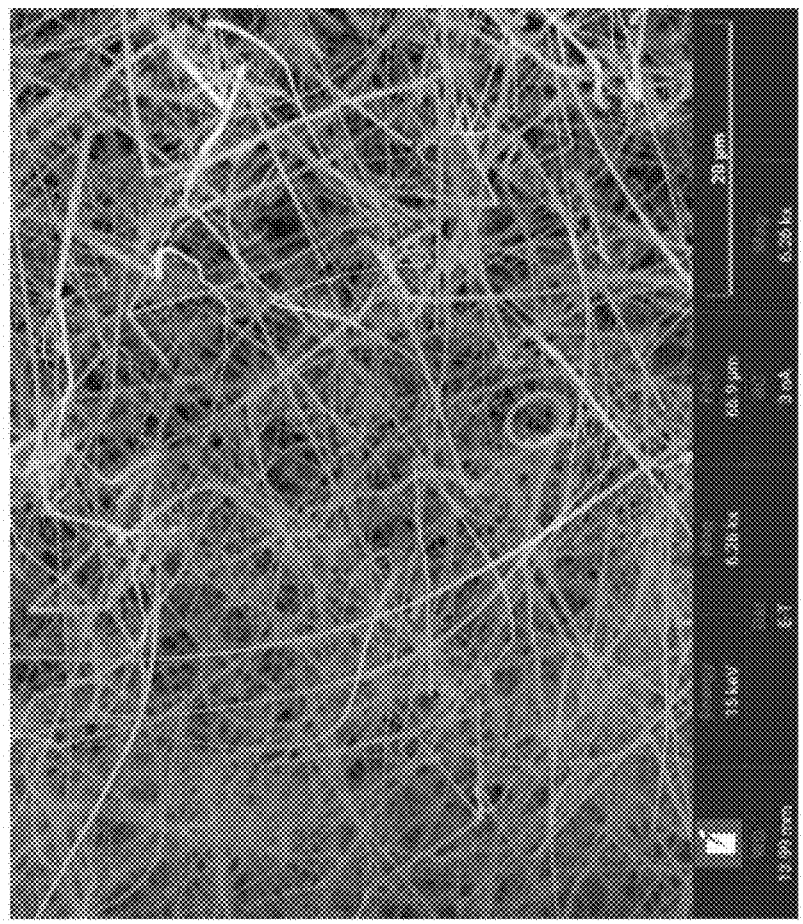
FIG. 32A and FIG. 32B are SEM pictures of Al-based nano-absorbers in the shape of micro-wires, which are semi-crystalline.
Figure 32B:
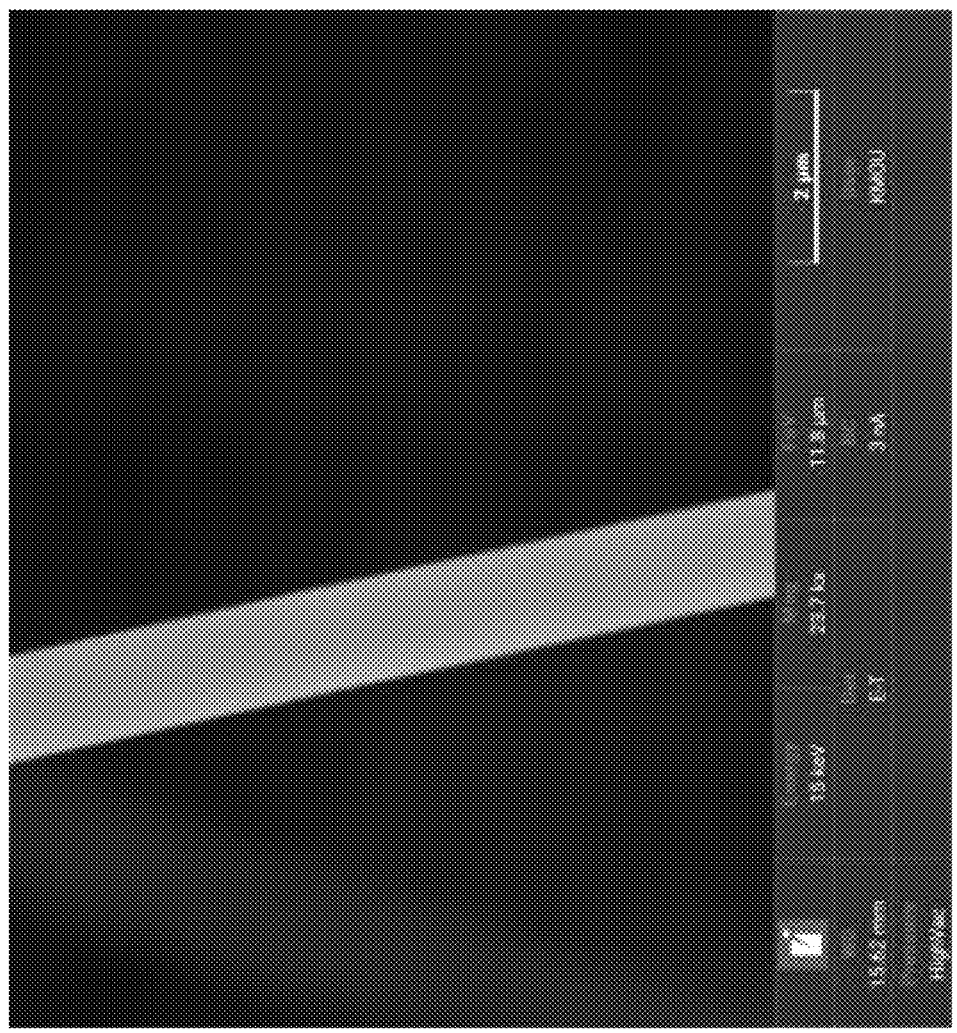

FIG. 32A and FIG. 32B are SEM pictures of Al-based nano-absorbers in the shape of micro-wires, which is semicrystalline. It is noted that Al-based nano-absorbers are formed in the shape of a nano-wire.

Al-based nano-absorbers are coupled to $NH_3$ of the space group Fm3m to form the hexagonal system which has the Wurtzite crystalline structure in a shape of the space group P63mc. Once the solid materials are set in an initial setting in the manufacturing method according to the present invention, they are not further supplied during the progress of the method. When the amount of AlCl rapidly decreases, Al-based nano-absorbers remain and AlN nano-wires are not completely formed.

At this time, large amounts of $SiCl_n$ are generated, and then Al-based nano-absorbers absorb Si atoms to form Si stems. Si micro-needles have a hexagonal structure having covalent bonds, which are a Wurtzite crystalline structure or a hexagonal 2H structure.

The hexagonal silicon crystals remaining in the shape of a stem (Shape 1: needle) shown in FIG. 7 become needle-shaped hexagonal silicon crystals.

An Al-based nano-absorber shown in Shape 2 of FIG. 7 forms a snowflake shape in which Si branches are formed around a Si stem by increasing its size to form hexagonal silicon crystals.

An Al-based nano-absorber shown in Shape 3 of FIG. 7 forms a hexagonal silicon epitaxy on a substrate such as a SiC substrate in the growth mold 240, increasing its size transversely.

It is noted that the formation of Al-based nano-absorbers is similar to that of snowflakes. There are several phases of water including ice I h (hexagonal ice crystals), also known as ice-phase-one is the hexagonal crystal form of ordinary ice, or frozen water. Particularly, snow has the most stable crystal structure in a water molecule. During initial formation, water has a shape of a hexagonal plate and changes into branches, and then into various shapes of crystal including snowflakes. This formation process of snowflakes can explain the growth of hexagonal crystal according to the present invention. According to the Wegener-Bergeron-Findeise process, water droplets can coexist with ice in a oversaturated environment, at a constant temperature and pressure in an ice core while water molecules in the air attach to the surface of the ice and consequently grow together. Because water droplets are more than ice crystals, it is possible for water droplets to rapidly grow into snow crystals in large sizes ranging from several micrometers to several millimeters. As such, after Al-based nano-absorbers are generated, activated concentration of the Al-based nano-absorbers can be changed to from a new material. Conventional approaches can obtain hexagonal crystals, particularly hexagonal silicon crystals only at a very high pressure of over 16 GPa. It is rarely reported about pure hexagonal Si crystal independently grown at atmospheric pressure. The present invention has advantages that very stable hexagonal Si single crystals can be grown at atmospheric pressure by generating Al-based nano-absorbers.

Figure 9:
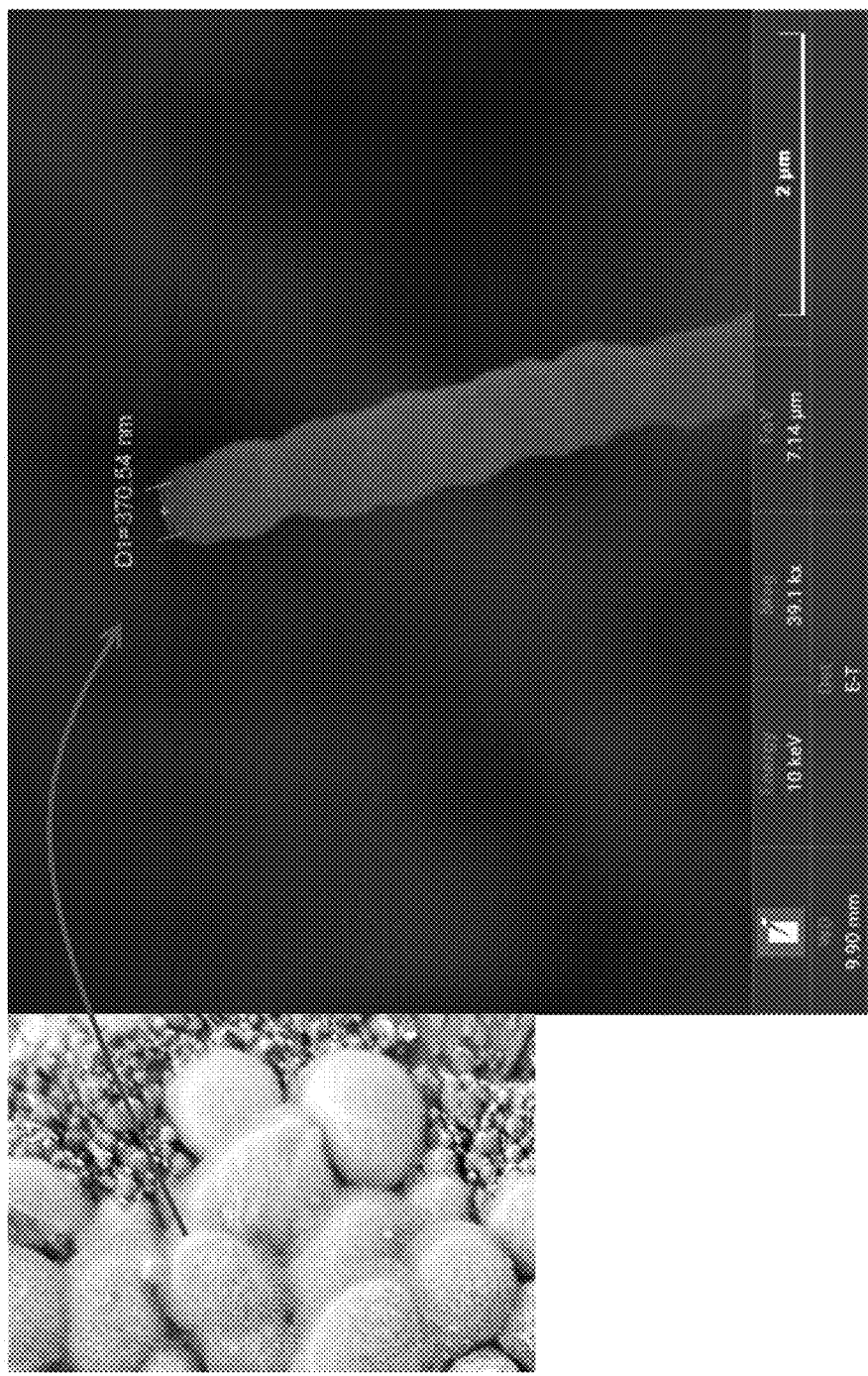
FIG. 9 shows a generation of Al-based nano-absorbers and their roots in a growth mold.

FIG. 9 shows a generation of Al-based nano-absorbers and its roots in a growth mold 240 of the crystal growth part 220. During the generation of Al-based nano-absorbers, $SiHCl_3$, AlCl, and $GaCl_n$ gases react with ammonia gas and absorb gallium, aluminum, and carbon to generate Al-based nano-absorbers. Al-based nano-absorbers then form in the shape of a needle which takes the semicrystalline form in a structurally very weak shell. This needles develop into a new shape in a short time in a saturated $SiCl_n$ atmosphere and then absorb Si atoms served as absorbers. At this time, nuclei have a hexagonal structure having covalent bonds, which are a Wurtzite crystalline structure or a hexagonal 2H structure. While reactions are continued, parasitic Si including Al and N elements explosively grows. Similar to site-competition epitaxy in which doped concentrations of impurities are controlled elements in a space, Si atoms push out Al, N, and C atoms according to the very rapid depletion of aluminum and gallium and finally form Si micro-needles as Si single crystals. As the concentration of Si increases rapidly more than the concentration of Al, Si atoms outcompete Al atoms and then occupy the positions of Al atoms. When silicon crystal grows, Si atoms occupied the hexagonal structure of Al-based nano-absorbers which is the most stable structure to grow hexagonal silicon crystals. Hexagonal silicon crystals are rapidly grown to have a plate shape with a diameter of several tens of μm to several inches and a thickness of several mm. Substituted Al and N atoms are pushed to the surface and discharged by high temperature.

Figure 8:
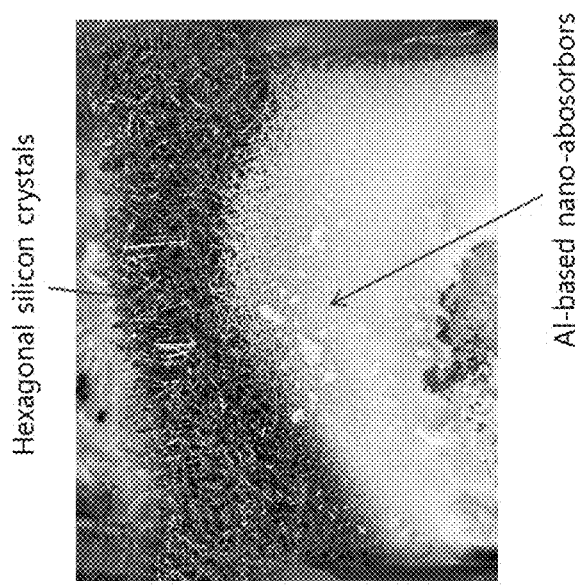
FIG. 8 shows growth of hexagonal silicon crystals according to the present invention, in which an area of Al-based nano-absorbers and an area of hexagonal silicon crystals is divided.

FIG. 8 shows a picture illustrating growth of hexagonal silicon crystals in the source allocating part 210 according to the present invention, in which an area of Al-based nano-absorbers and an area of hexagonal silicon crystals are divided.

Figure 10:
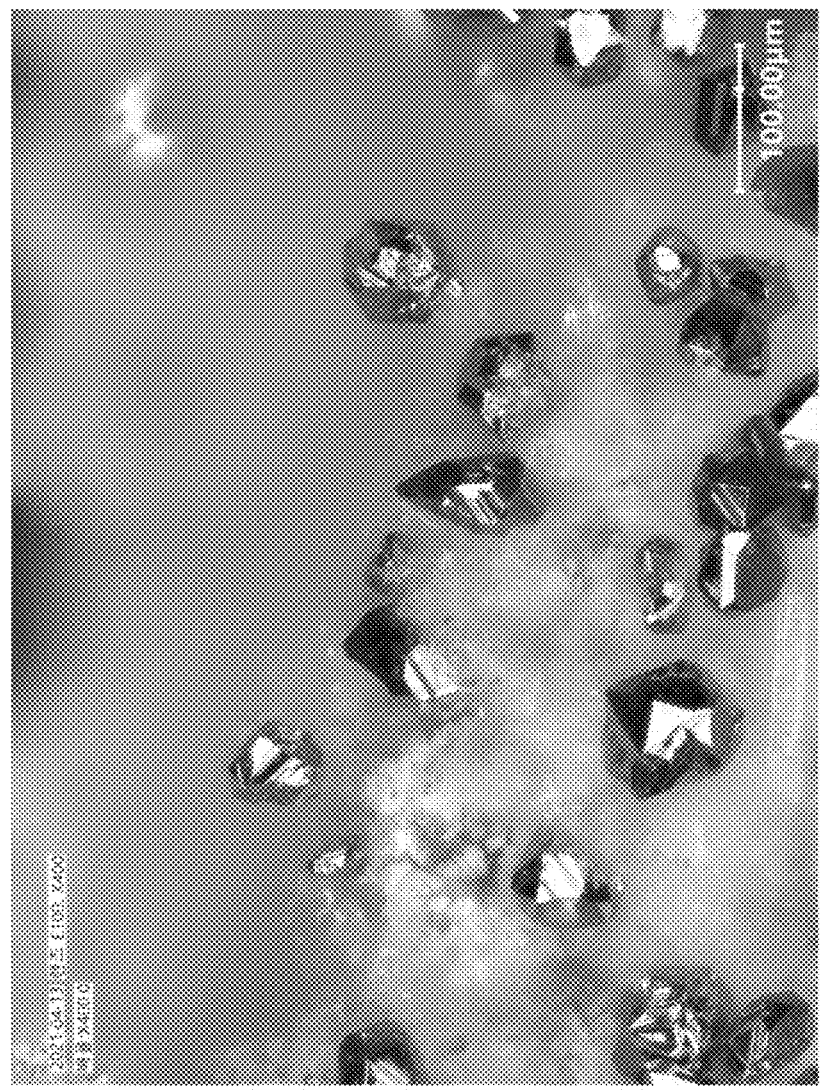
FIG. 10 shows nuclei of Si crystal in which Al-based nano-absorbers in the shape of nano-clusters absorb Si atoms.

FIG. 10 shows nuclei of Si crystals in which Al-based nano-absorbers in the shape of nano-clusters absorb Si atoms. As shown, Si nuclei are formed among the nano-clusters which are clumped together like downy hairs.

Table 1 shows generation conditions for hexagonal silicon crystal and Al-based nano-absorbers and experimental data according to an embodiment of the present invention.

TABLE 1

|  | Conditions | Experiments |
|---|---|---|
| Temperature of reaction tube | 1200-1350° C. | 1200° C. |
| Hydrogen chloride gas | 200-1000 sccm | 500 sccm |
| Growth time | 1-5 h | 10-80 min |

TABLE 1-continued

| | Conditions | Experiments |
|---|---|---|
| Amount of silicon | 10 g-100 g | 15 g-30 g |
| Amount of gallium | 10-100 g or less | 20 g |
| Amount of aluminum | 10-100 g or less | 25 g or less |
| Ammonia gas | 200-1000 sccm | 500 sccm |
| Nitrogen gas | 1000-5000 sccm | 5000 sccm |
| Doping material | Mg, Te, Ge, B, P, Sb | — |
| Efficiency forming Al-based nano-absorbers | 150% (Al/Si ratio) | 100% in growth time of 10 min |
| | 80% (Al/Si ratio) | 60% in growth time of 10 min |

Growth conditions of hexagonal Si crystals of Table 1 and results will now be described. Hydrogen chloride, ammonia, and nitrogen gases were uniformly provided at 500 sccm, 500 sccm, and 5000 sccm, respectively. Growth temperature and growth time were set to 1200° C. and 10-80 min, respectively. When Al/Si ratio were 150% and 80%, efficiencies forming Al-based nano-absorbers were 100% and 60% at maximum, respectively, in growth time of 10 min. A mass ratio of silicon: aluminum:gallium is 0.80-1.5:1.25:1. That is, a ratio of aluminum to silicon ranges from 80%-150%.

Figure 11:
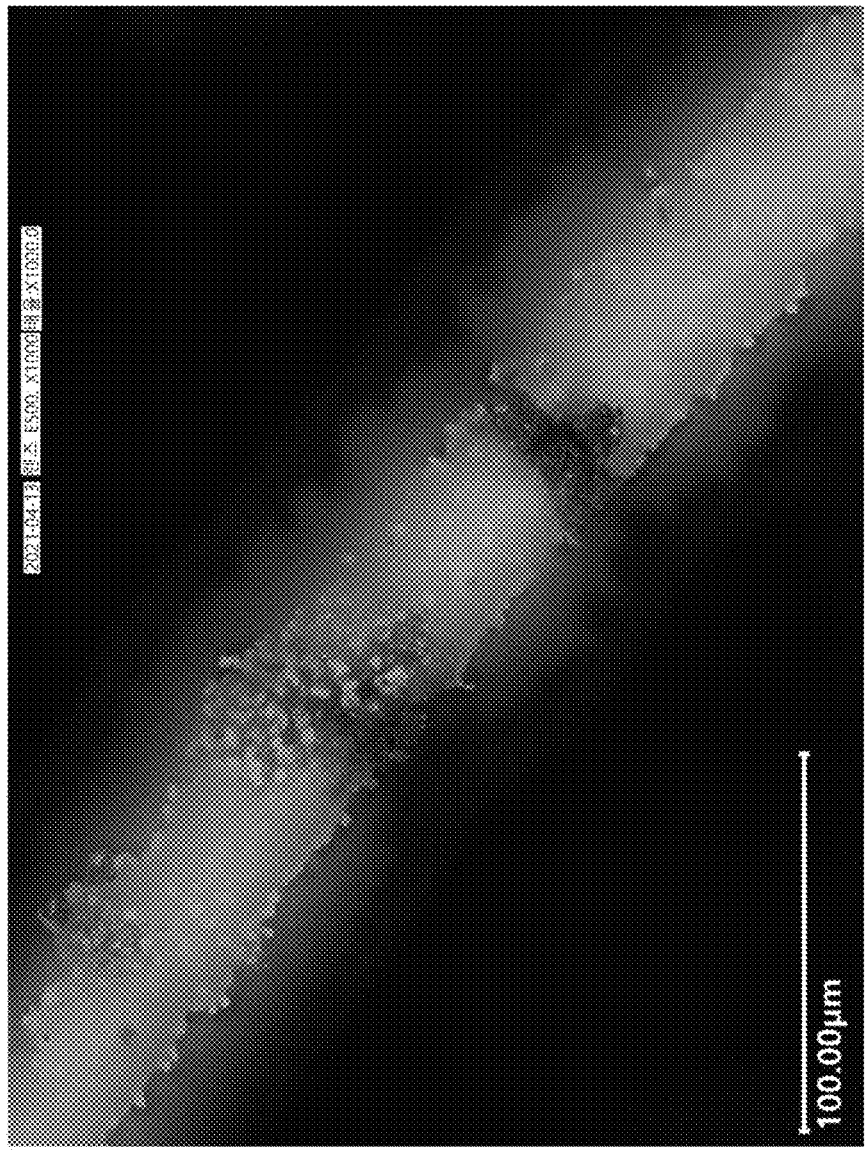
FIG. 11 shows nuclei of Si crystal in which Al-based nano-absorbers in the shape of nano-wires absorb Si atoms.

FIG. 11 is a picture showing nuclei of Si crystal in which Al-based nano-absorbers in the shape of nano-wires absorb Si atoms. As shown, Al-based nano-absorbers grow to have a micro-size and absorb silicon atoms.

Figure 12:
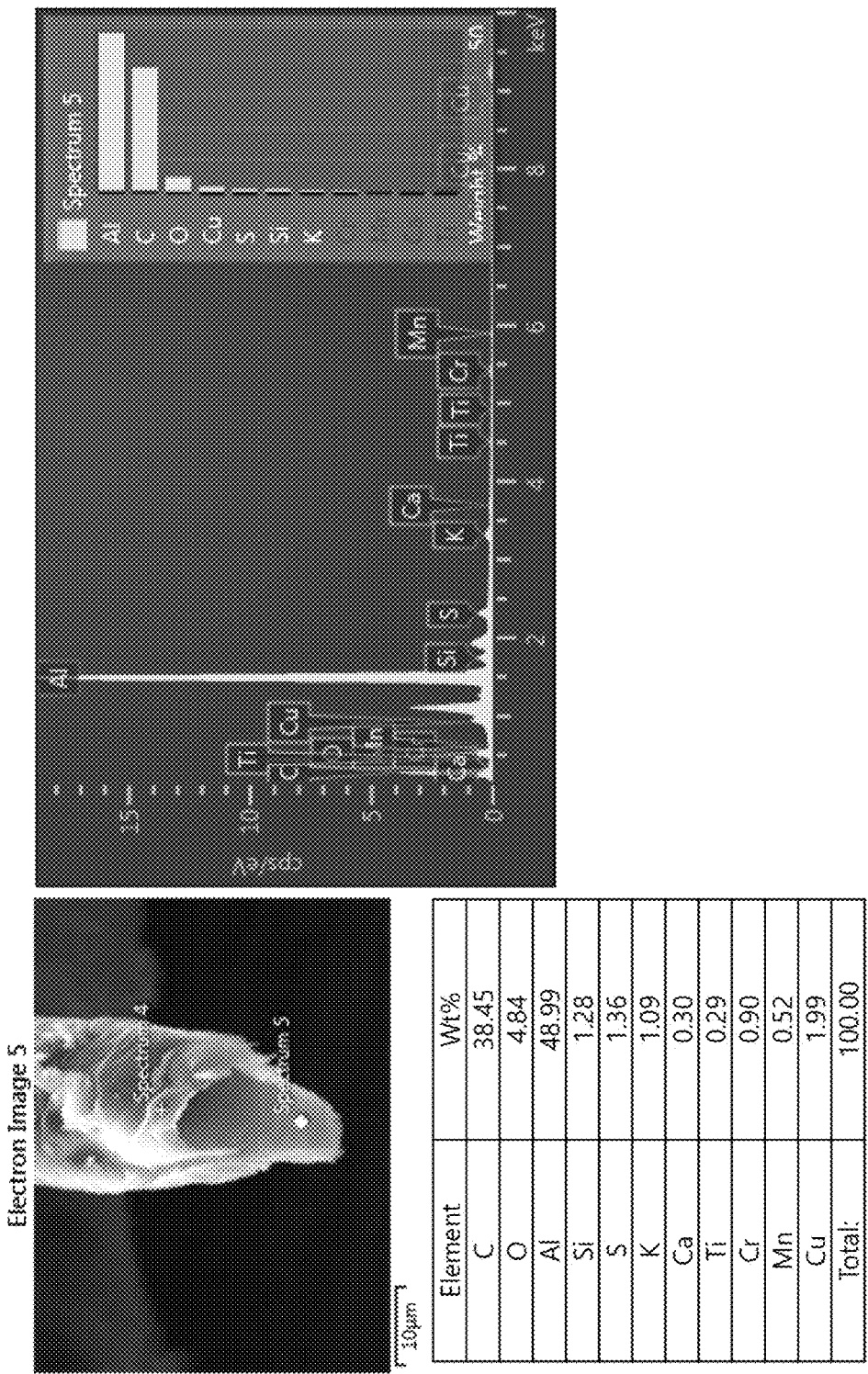
FIG. 12 shows spectrum results of Energy Dispersive X-ray Spectroscopy (EDS) inside Al-based nano-absorbers in the shape of nano-wires.

FIG. 12 shows a picture and spectrum results of Energy Dispersive X-ray Spectroscopy (EDS) inside Al-based nano-absorbers in the shape of nano-wires. It is noted that the elements of C, O, Si, S, etc. exist around Al. In this regard, this material is named Al-based nano-absorbers by the inventors of the present invention.

Figure 13:
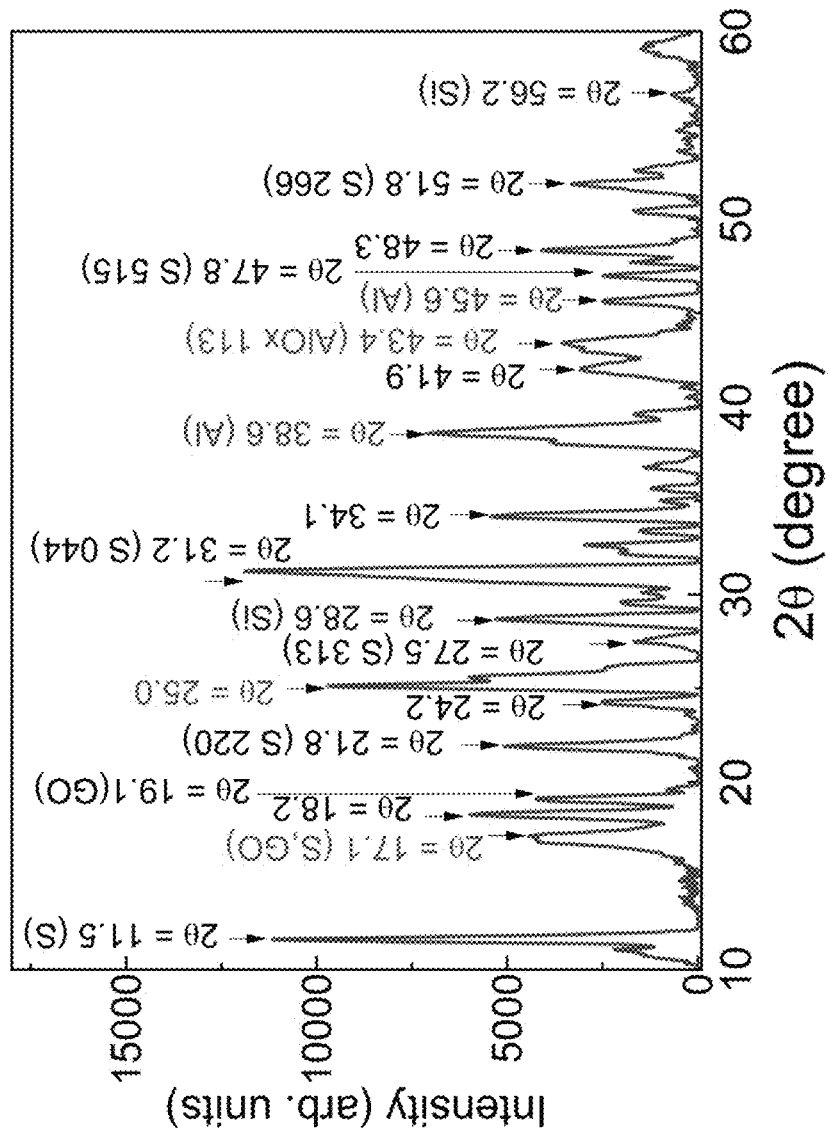
FIG. 13 shows results of X-Ray Diffraction (XRD) of Al-based nano-absorbers in the shape of nano-wires.

FIG. 13 shows results of X-Ray Diffraction (XRD) of Al-based nano-absorbers in the shape of nano-wires. It is noted that peaks relating to the EDS results of FIG. 12 are found among various peaks. That is, the origination of 6 peaks is explained referring to the EDS results.

The peaks [44-46] relate to S, the peaks [47-50] relate to Si and Al, the peaks [51-54] relate to C, the peaks [55] relate to SiC, and the peaks [56] relate to AlN.

REFERENCES

[44] Awwad A M, Salem N M, Abdeen A O 2015 Novel Approach For Synthesis Sulfur (S—NPs) Nanoparticles Using *Albizia julibrissin* Fruits Extract. Adv. Mater. Lett. 6, 432-435.

[45] Deshpande A S, Khomane R B, Vaidya B K, Joshi R M, Harle A S and Kulkarni B D 2008 Sulfur Nanoparticles Synthesis and Characterization from H2S Gas, Using Novel Biodegradable Iron Chelates in W/O Microemulsion. Nanoscale Res Lett. 3, 221-229.

[46] Radhika G, Subadevi R, Krishnaveni K, Liu W R and Sivakumar M 2018 Synthesis and Electrochemical Performance of PEG-MnO2-Sulfur Composites Cathode Materials for Lithium-Sulfur Batteries. J. Nanosci. Nanotechnol. 18, 127-131.

[47] Wen J Z, Ringuette S, Bohlouli-Zanjani G, Hu A, Nguyen N H, Persic J, Petre C F and Zhou Y N 2013 Characterization of thermochemical properties of Al nanoparticle and NiO nanowire composites. Nanoscale Res Lett. 8, 184-193.

[48] Cava S, Tebcherani S M, Souza I A, Pianaro S A, Paskocimas C A, Longo E and Varela J A 2007 Structural characterization of phase transition of Al2O3 nanopowders obtained by polymeric precursor method. Mater. Chem. Phys. 103, 394-399.

[49] Krause B et al 2018 Characterization of aluminum, aluminum oxide and titanium dioxide nanomaterials using a combination of methods for particle surface and size analysis. RSC Adv. 8 14377-14388.

[50] Du X, Gao T, Qian Z, Wu Y and Liu X 2018 The in-situ synthesis and strengthening mechanism of the multi-scale SiC particles in Al—Si—C alloys. J. Alloys Compd. 750, 935-944.

[51] Zhang H, Quan L and Xu L 2017 Effects of Amino-Functionalized Carbon Nanotubes on the Crystal Structure and Thermal Properties of Polyacrylonitrile Homopolymer Microspheres. Polymers 9, 332-344.

[52] Wu T M, Lin Y W and Liao C S 2005 Preparation and characterization of polyaniline/multi-walled carbon nanotube composites. Carbon 43, 734-740.

[53] Muller C, Golberg D, Leonhardt A, Hampel S and Buchner B 2006 Growth studies, TEM and XRD investigations of iron-filled carbon nanotubes. phys. stat. sol. (a) 203, 1064-1068.

[54] Gascho J L S, Costa S F, Recco A C and Pezzin S H 2019 Graphene Oxide Films Obtained by Vacuum Filtration: X-Ray Diffraction Evidence of Crystalline Reorganization. J. Nanomater 2019, 1-12

[55] Brauer G, Anwand W, Eichhorn F, Skorupa W, Hofer C, Teichert C, Kuriplach J, Cizek J, Prochazka I, Coleman P G, Nozawa T and Kohyama A 2006 Characterization of a SiC/SiC composite by X-ray diffraction, atomic force microscopy and positron spectroscopies. Appl. Surf. Sci. 252, 3342-3351.

[56] Al Tahtamouni T M, Li J, Lin J Y and Jiang H X 2012 Surfactant effects of gallium on quality of AlN epilayers grown via metal-organic chemical-vapour deposition on SiC substrates. J. Phys. D: Appl. Phys. 45, 285103 1-4.

Al has a face centered cubic lattice (FCC) structure with a density of 2.7 g/cm$^3$, and without corresponding atoms, about 26% of the space is empty. Resultantly, this empty space can be occupied by carbon atoms or similar atomic species. When Al is combined with N, a hexagonal structure of a Wurtzite crystalline structure is obtained. Si atoms substitute for Al, N, and C atoms following the rapid depletion of gallium and aluminum, in order to form hexagonal silicon crystals.

Figure 14:
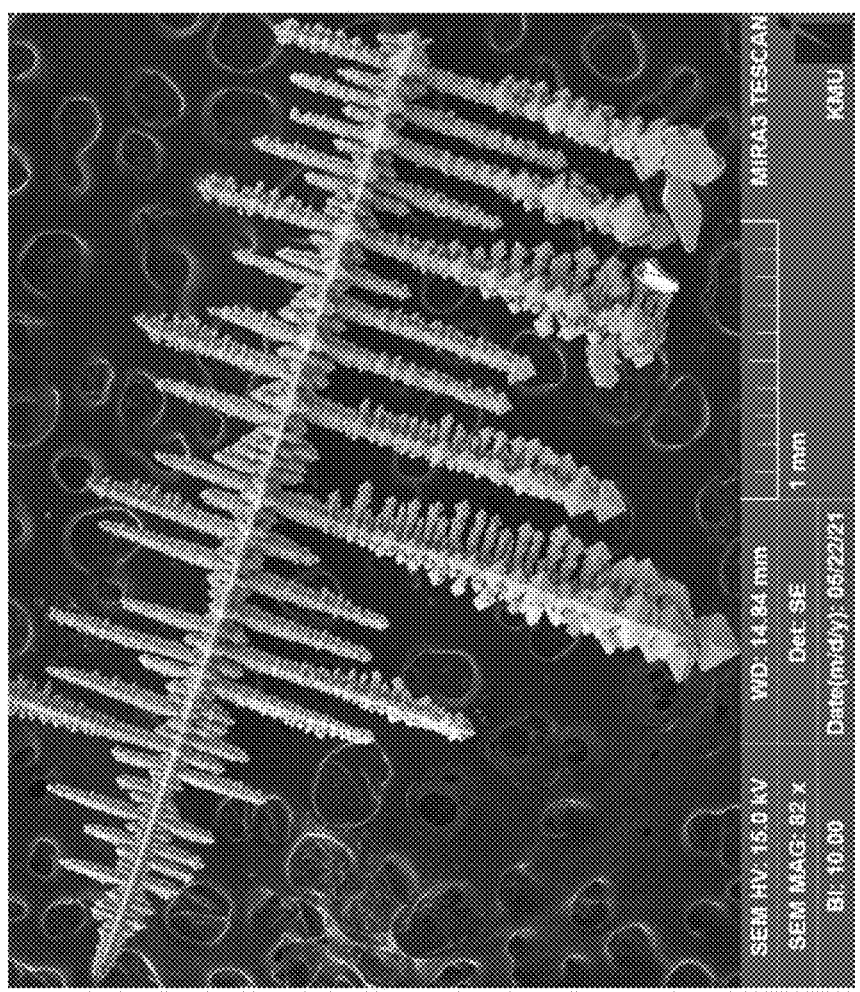
FIG. 14 shows a picture illustrating Al-based nano-absorbers in the shape of snowflakes.
Figure 15:
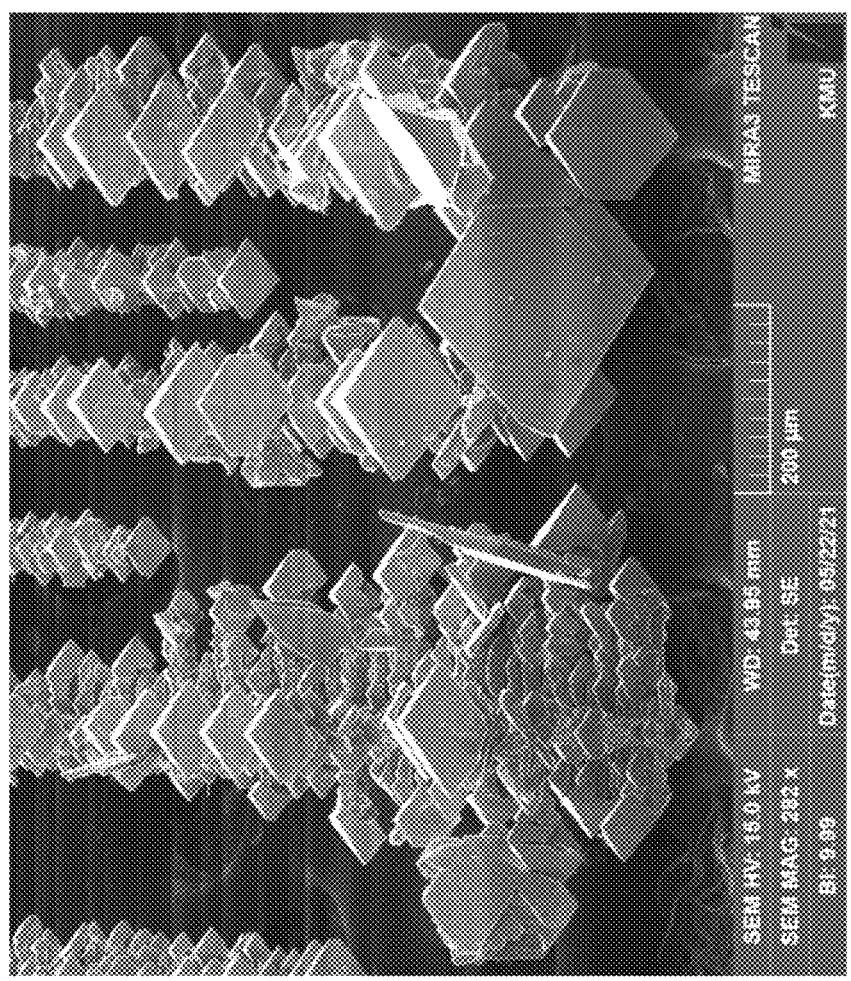
FIG. 15 shows generation of hexagonal Si crystals on a part of Al-based nano-absorbers in the shape of snowflakes.

FIG. 14 and FIG. 15 show SEM photos illustrating Al-based nano-absorbers in the shape of snowflakes in the crystal growth part 220. As shown in FIG. 7, Al-based nano-absorbers evolve in the shape of snowflakes in a growth time of 30 min or more. After 60 minutes of growth time, some of the snowflakes of Al-based nano-absorbers in FIG. 14 evolve to the snowflake shape of FIG. 15.

Figure 16:
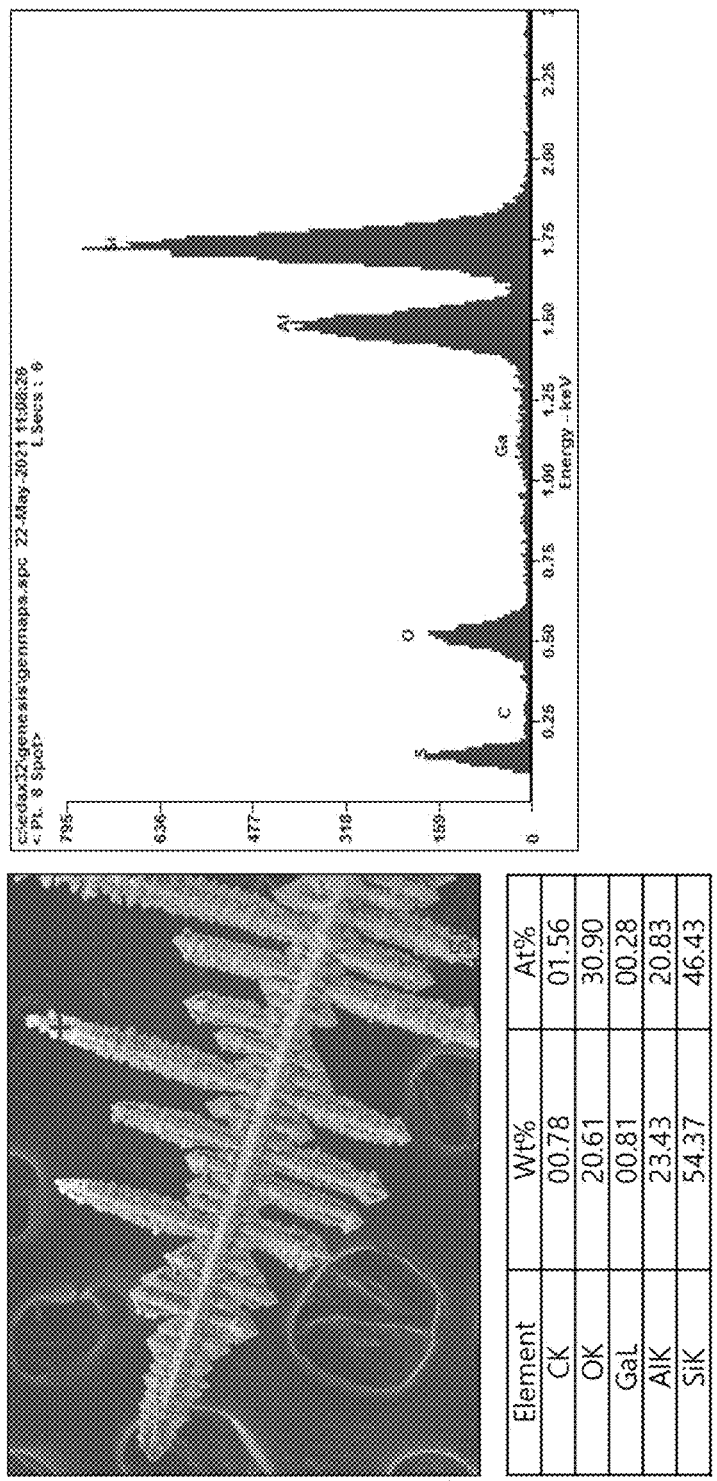
FIG. 16 shows EDS data of Al-based nano-absorbers in the shape of snowflakes.

FIG. 16 shows EDS data of Al-based nano-absorbers of FIG. 13. It is noted that Al-based nano-absorbers change to silicon crystals by the absorption of Si atoms.

Figure 17:
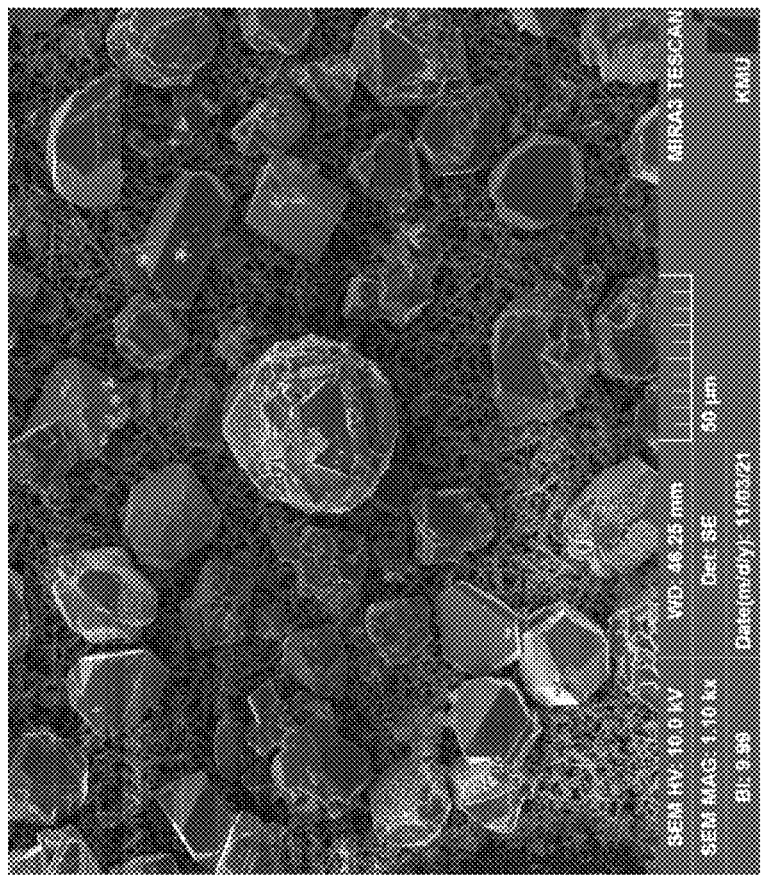
FIG. 17 shows grown Si nuclei on a 4H—SiC substrate after generating Al-based nano-absorbers.

FIG. 17 shows SEM photos showing grown Si nuclei on a 4H—SiC substrate in the growth mold 240 after generating Al-based nano-absorbers.

Figure 18:
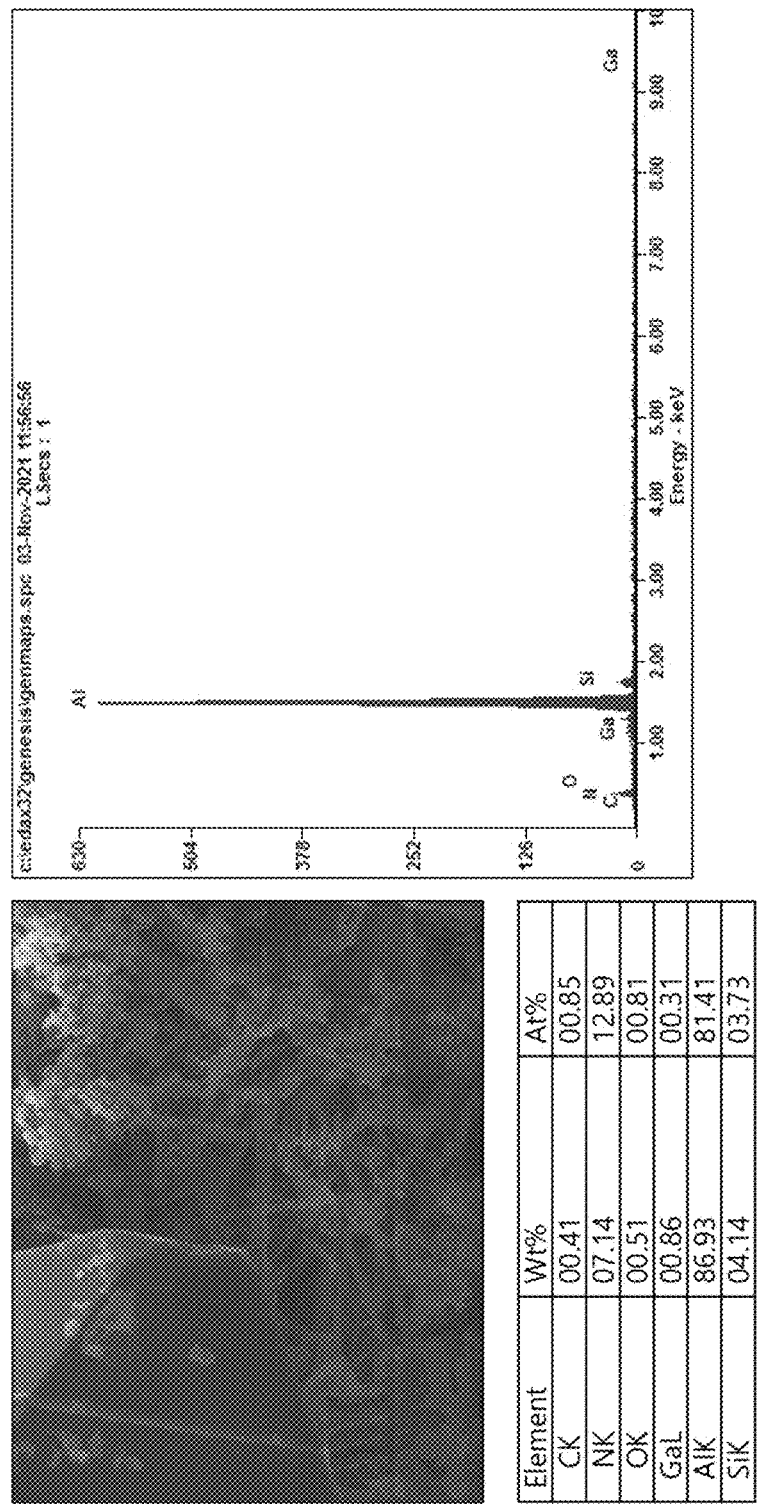
FIG. 18 shows EDS data of Al-based nano-absorbers on a 4H—SiC substrate.

FIG. 18 shows EDS data of Al-based nano-absorbers at a point indicated in a red box of FIG. 17. It is noted that the Al-based nano-absorbers contain 81% or more of Al, and remainders of C, N, O, Ga, Si, and so forth.

Figure 19A:
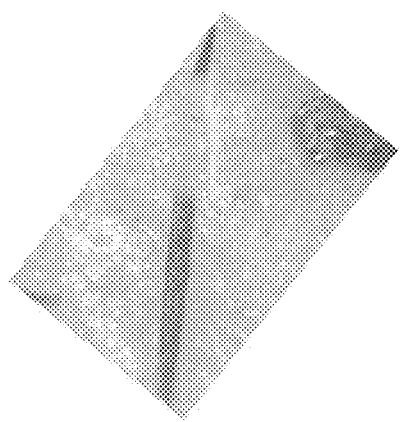
FIGS. 19A-FIG. 19C show a sample while Si atoms are absorbed by Al-based nano-absorbers.
Figure 19B:
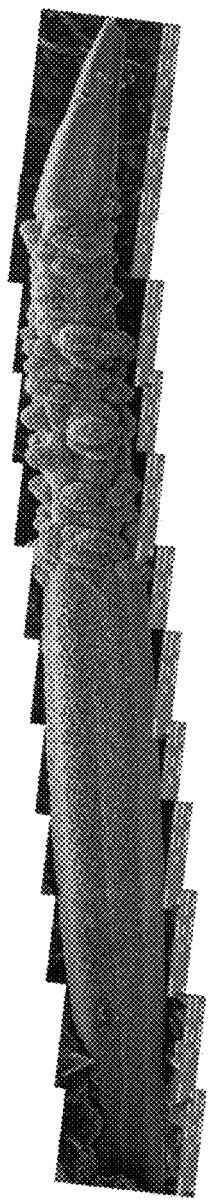
Figure 19C:
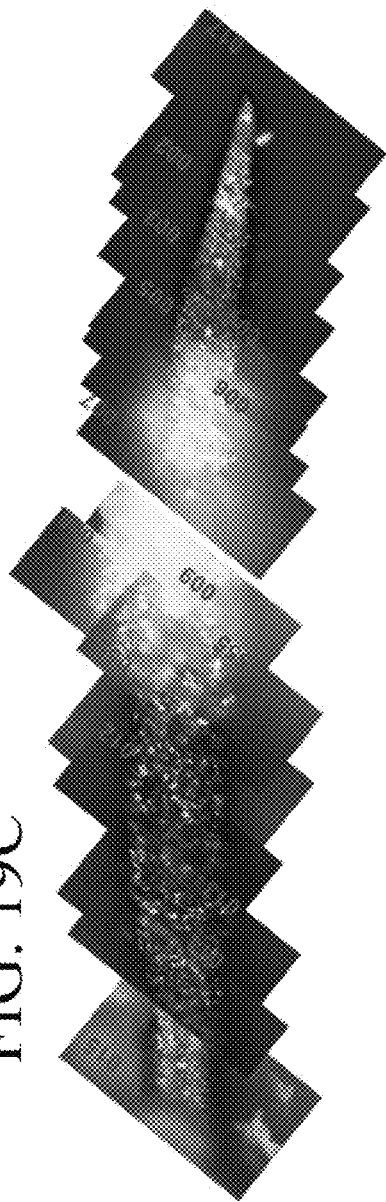
Figure 19D:
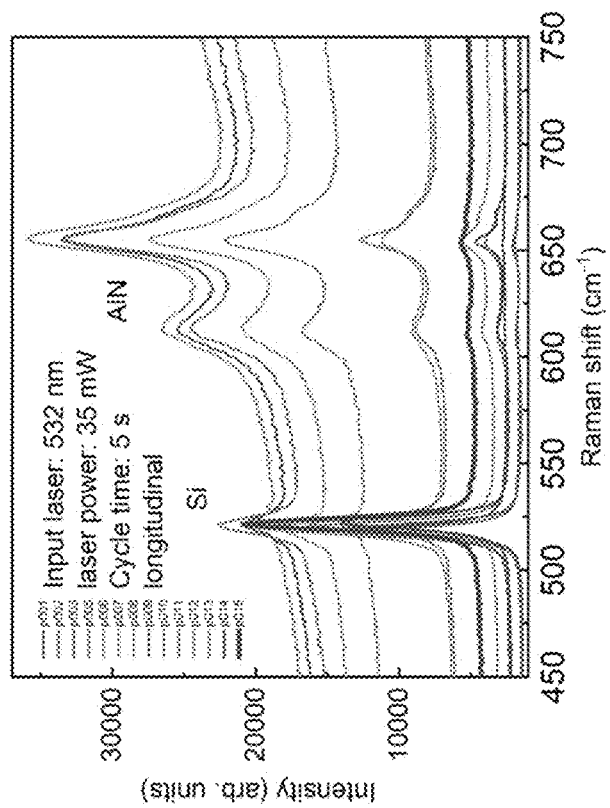
FIG. 19D shows Raman data.

FIGS. 19A-19C show a sample while Si atoms are absorbed by Al-based nano-absorbers in the crystal growth part 220, and FIG. 19D shows its Raman data. FIG. 19A is an optical picture of an entire sample, in which a yellow portion of a needle shape at a growth time of 30 min can be confirmed. This yellow portion confirms that Al-based nano-absorbers undergo changes by absorbing Si atoms. That is, two silicon crystal portions are formed on both sides around the yellow portion. FIG. 19B is a FE-SEM picture and FIG. 19C is an optical picture by Raman measuring apparatus with measured positions indicated.

FIG. 19D shows data in which modes relating to AlN at 612 cm$^{-1}$ ($A_{1g}$), 654 cm$^{-1}$ ($E_{2g}$), and 666 cm$^{-1}$ ($E_{1g}$) on the yellow portion. A single peak at 519 cm$^{-1}$ relating to silicon is also observed, although its intensity is low. At the border of the yellow portion, the intensities of a silicon peak at 519 cm$^{-1}$ and AlN peak at 654 cm$^{-1}$ are reversed. This means that Si atoms absorbed by Al-based nano-absorbers are undergoing growth of silicon crystals.

Figure 20:
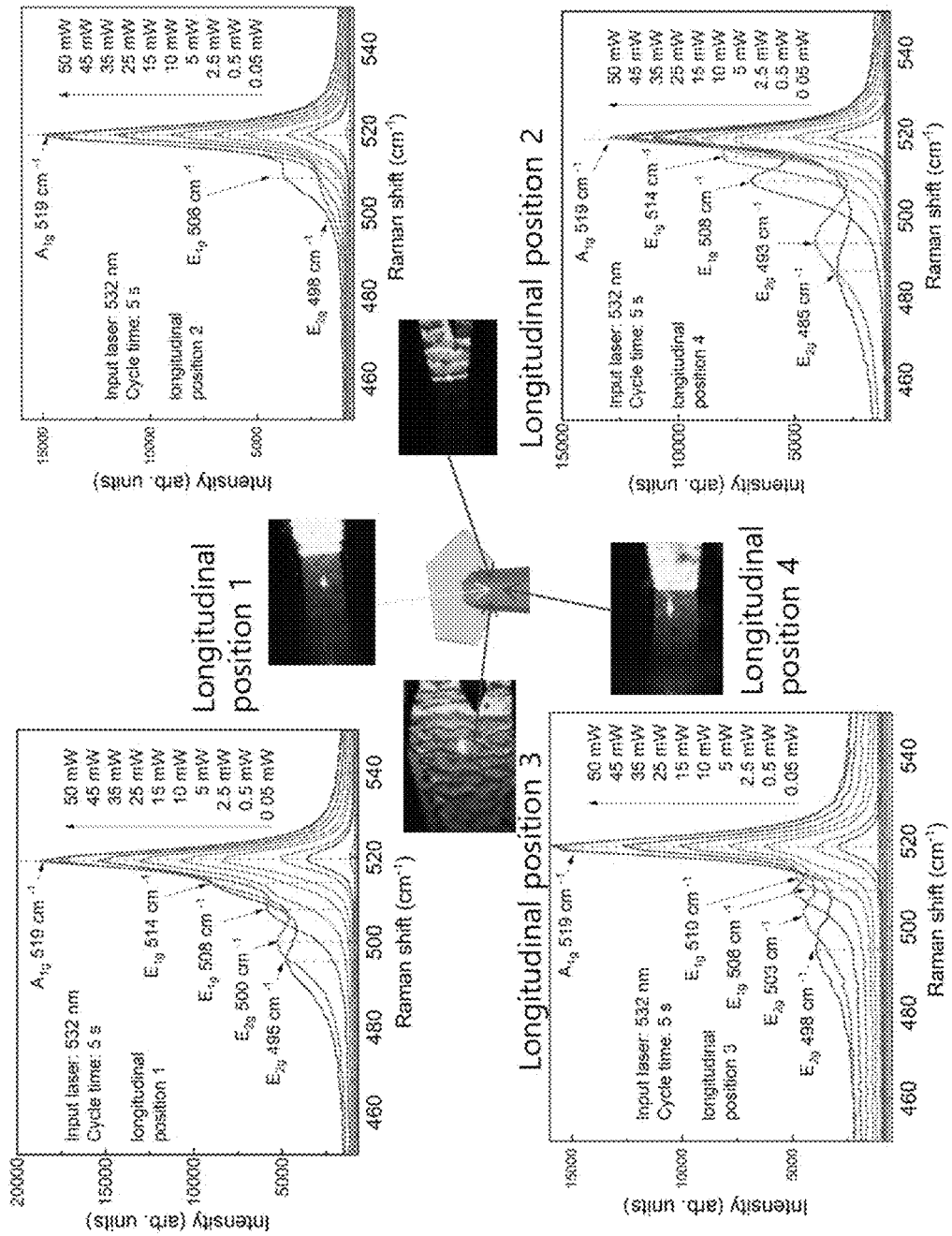
FIG. 20 shows Raman data of hexagonal Si crystals using Al-based nano-absorbers.

FIG. 20 shows Raman data of hexagonal Si crystals in the crystal growth part 220 at early growth. In the case of hexagonal Si single crystals, a peak of an $A_{1g}$ mode is observed at 518 cm$^{-1}$-519 cm$^{-1}$. A peak of an $E_{1g}$ mode of single crystal hexagonal Si is observed at 514 cm$^{-1}$-508 cm$^{-1}$. In the case of cubic Si crystals, a single Raman peak at 521 cm$^{-1}$ is observed.

The Raman data of FIG. 20 were measured to four points of the early growth in a surface of hexagonal silicon crystals. As shown in graphs, the strongest Raman peak was observed at 518 cm$^{-1}$-519 cm$^{-1}$, and other peaks are observed at 514 cm$^{-1}$-508 cm$^{-1}$ and 500 cm$^{-1}$-495 cm$^{-1}$. Accordingly, a peak at 500 cm$^{-1}$-495 cm$^{-1}$ of FIG. 20 is a typical $E_{2g}$ peak, and this confirms that the crystal grown according to the present invention is hexagonal silicon crystals.

Figure 21:
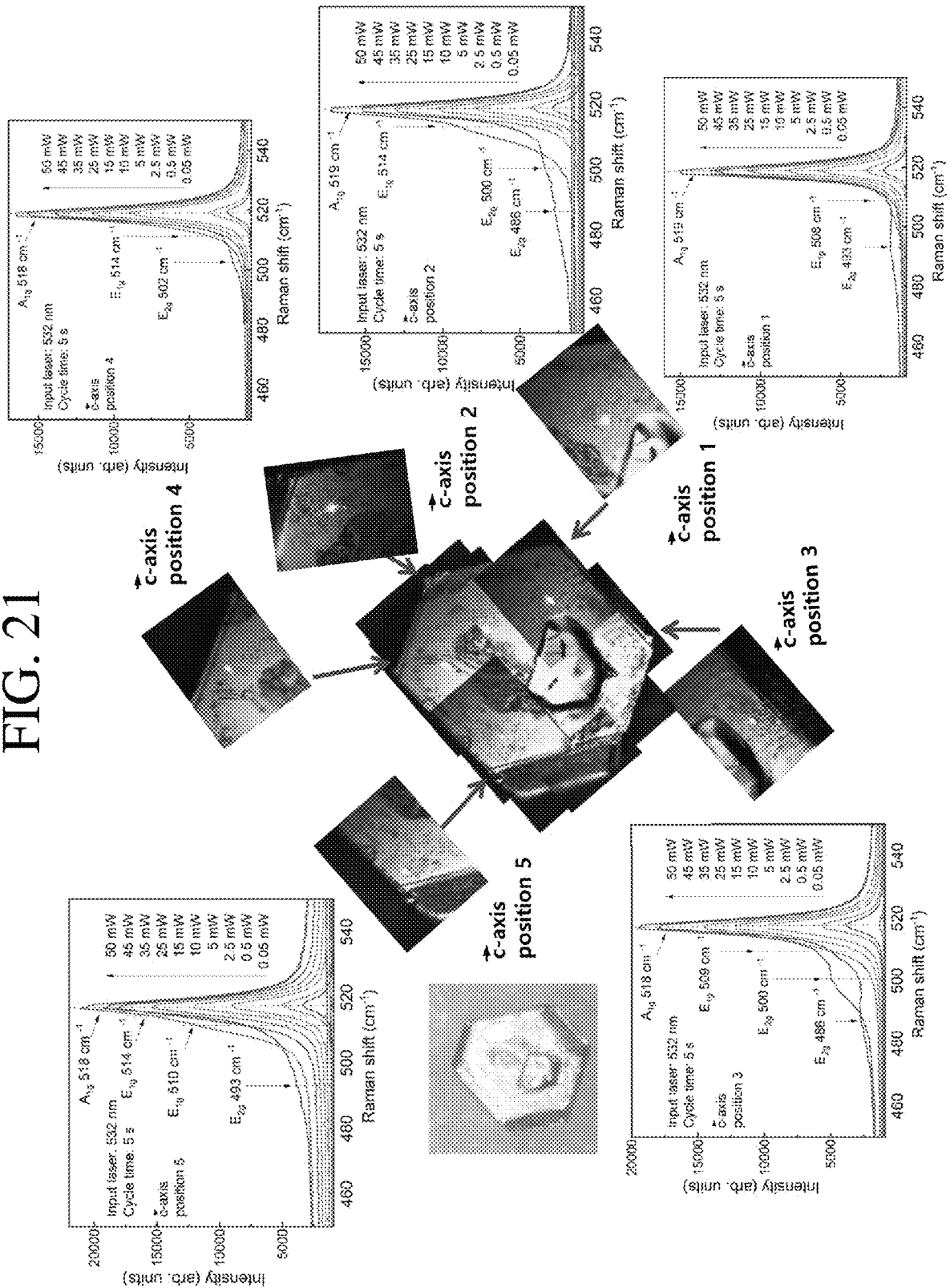
FIG. 21 shows Raman data of hexagonal Si crystals measured at the point of the top flat portion in FIG. 20.

FIG. 21 shows Raman data of hexagonal Si crystals measured at the point of the top flat portion in FIG. 20. The Raman data were measured at five points of the top flat portions which were separated from the hexagonal stem. Raman peaks at all five points were observed at 518 cm-1, 508 cm$^{-1}$-514 cm$^{-1}$, and 493 cm$^{-1}$-502 cm$^{-1}$. This means that a wide Raman peak combines the $A_{1g}$ mode with the $E_{1g}$ mode. In the case of the $E_{2g}$ mode, it were observed at all points and moved by about 9 cm$^{-1}$. The data confirms that the 518 cm$^{-1}$ peak represents the $A_{1g}$ mode, the 508 cm$^{-1}$-514 cm$^{-1}$ peak represents the $E_{1g}$ mode, and 4 the 93 cm$^{-1}$-502 cm$^{-1}$ peak represents the $E_{2g}$ mode. As such, the Raman data confirm that hexagonal silicon crystal grown belongs to the Oh7 (Fd3m) space group, according to the present invention.

Figure 22:
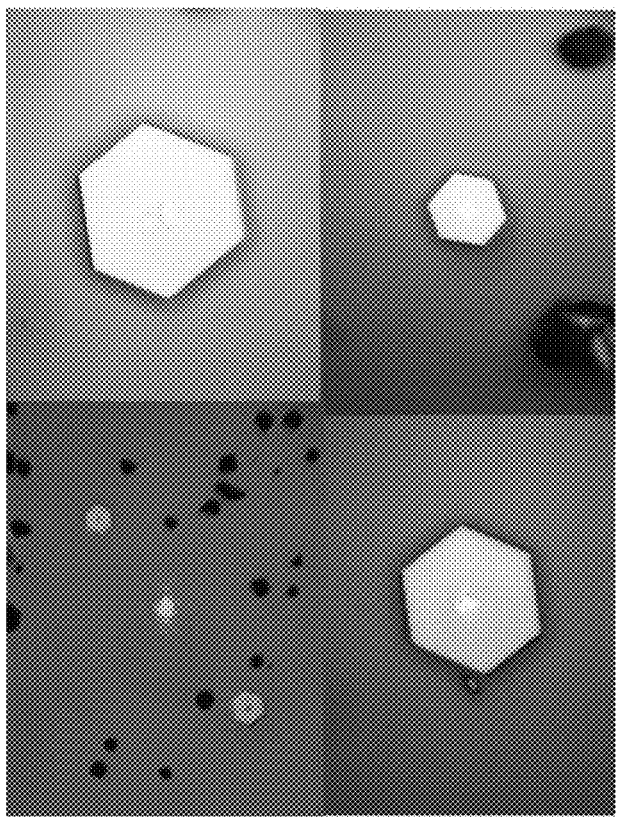
FIG. 22 shows pictures of hexagonal Si crystals grown on a 4H—SiC substrate using Al-based nano-absorbers.

FIG. 22 shows pictures of hexagonal Si crystal grown on a 4H—SiC substrate in the growth mold 240 of the crystal growth part 220, using Al-based nano-absorbers.

Figure 23:
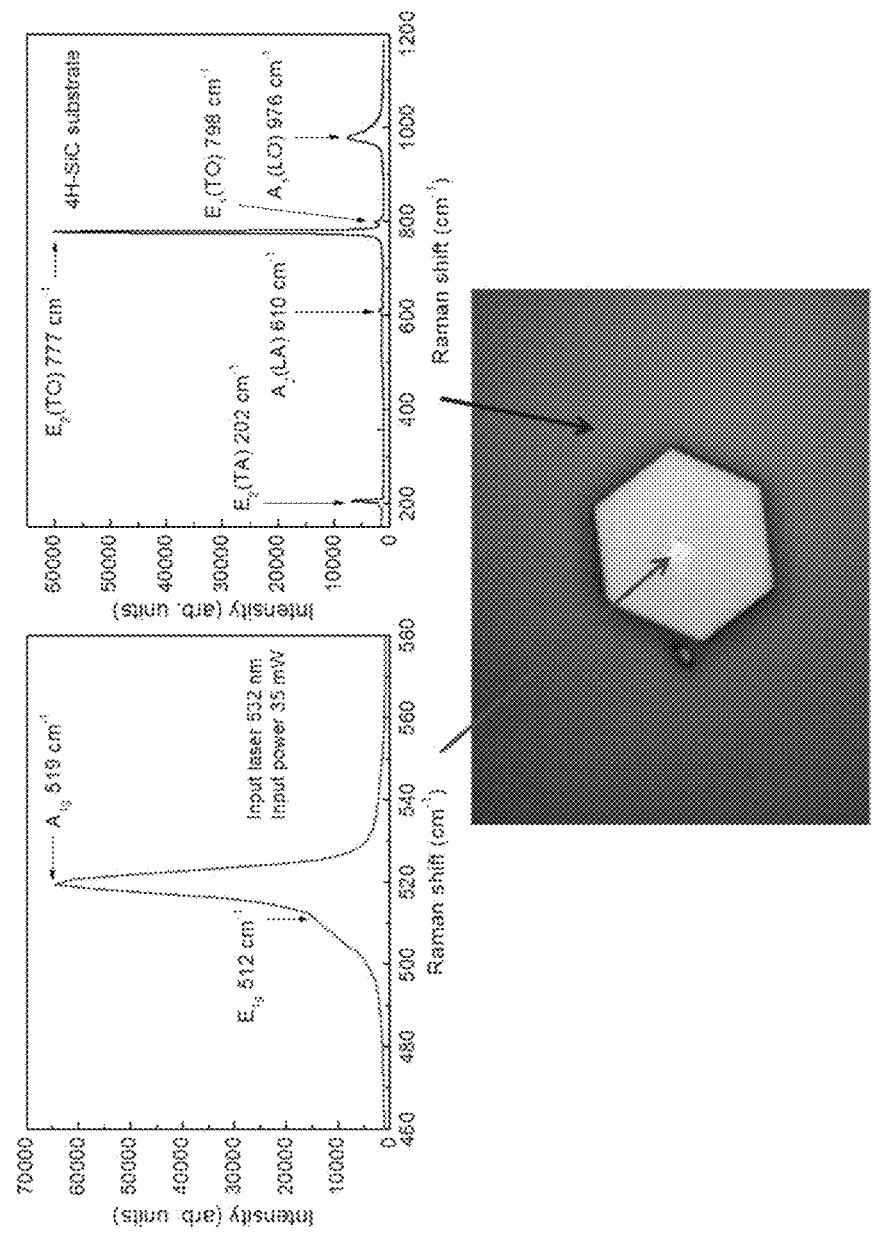
FIG. 23 illustrates Raman data of hexagonal Si crystal grown on a 4H—SiC substrate, using Al-based nano-absorbers.

FIG. 23 illustrates Raman data of a sample in the left bottom of FIG. 22, in which the $A_{1g}$ mode and the $E_{1g}$ mode are observed at peaks of 519 cm$^{-1}$ and 512 cm$^{-1}$, respectively. From the Raman data, hexagonal silicon crystal grown is clearly distinguished from the substrate of 4H—SiC.

Figure 24:
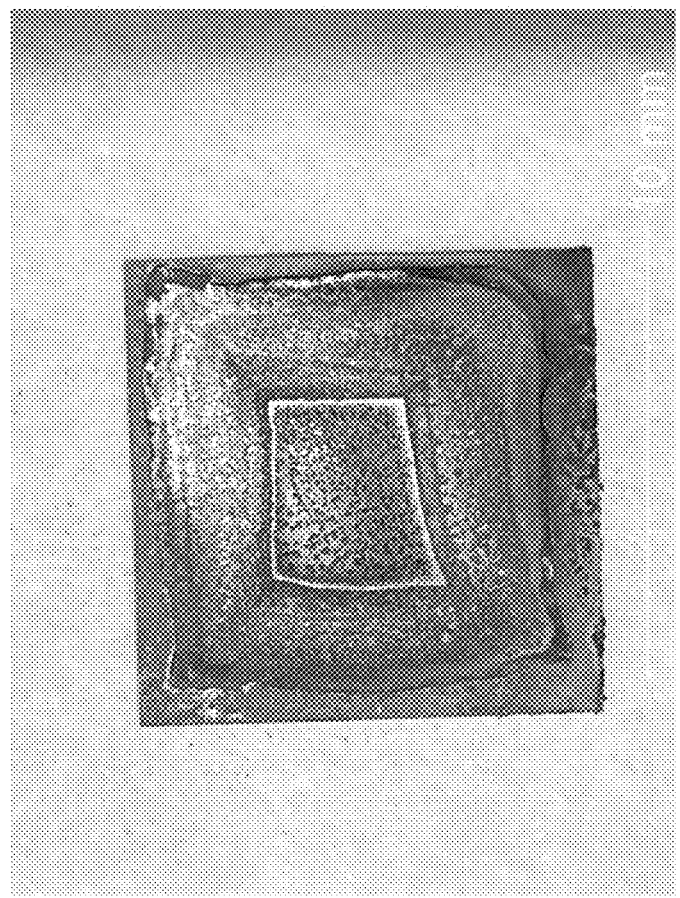
FIG. 24 shows a picture of hexagonal Si epitaxy grown on a 4H—SiC substrate, using Al-based nano-absorbers.

FIG. 24 shows a picture of hexagonal Si epitaxy on a 4H—SiC substrate, which was further grown in a large area from hexagonal silicon crystals of FIG. 23. The epitaxy of 8 mm×8 mm was grown on a 4H—SiC substrate of 10 mm×10 mm. Since the lattice mismatch between Si crystals and 4H—SiC is about 20%, it is generally difficult to grow a silicon epitaxy on a 4H—SiC substrate without any buffer layer. However, it is possible to grow a crystalline silicon epitaxy on a 4H—SiC substrate without any buffer layer, under atmospheric pressure using Al-based nano-absorbers according to the present invention.

Figure 25:
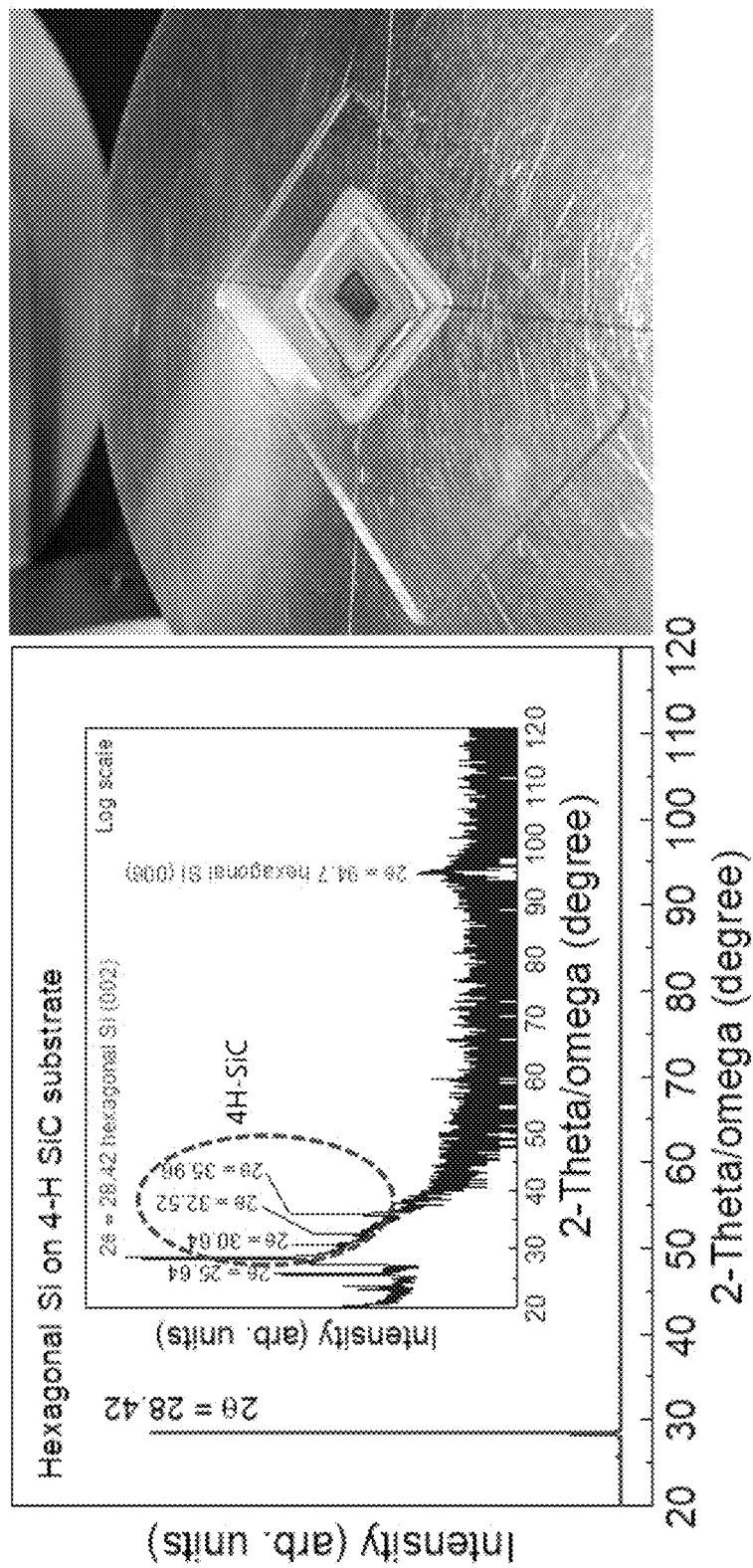
FIG. 25 shows XRD data of hexagonal Si epitaxy grown on a 4H—SiC substrate, using Al-based nano-absorbers.

FIG. 25 shows XRD data measured on hexagonal Si epitaxy of FIG. 24. XRD peaks relating to hexagonal Si crystals are observed at 2θ=28.38°, 47.30°, and 94.81°, while XRD peaks relating to 4H—SiC are observed at 2θ=33.09°, 35.93°, and 37.81°. Furthermore, a peak of 2θ=28.38° represents the (002) plane and a peak of 2θ=94.98° represents the (006) plane, according to ICSD ID 30396 (Physical Review, serie 3. B-condensed Matter (18, 1978-) 1992.46, 10086-10097). This confirms that hexagonal Si crystal grown is a crystal which belongs to the P63mc space group (lattice constant a=3.8 Å, c=6.26 Å).

Figure 26:
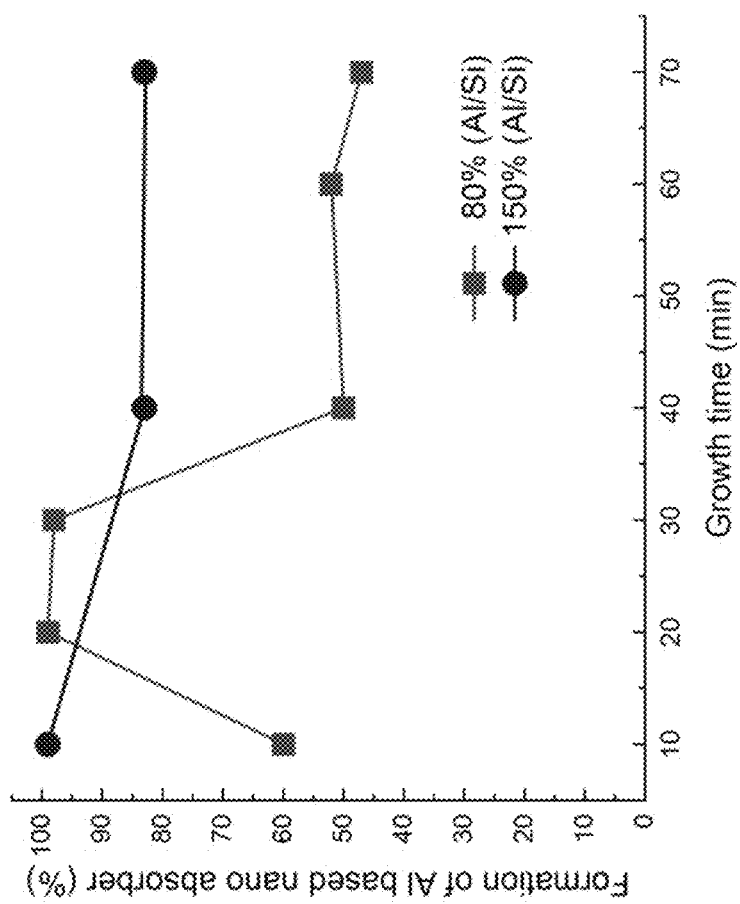
FIG. 26 shows a graph relating growth time and formation of Al-based nano-absorbers.

FIG. 26 shows a graph relating to growth time and formation of Al-based nano-absorbers. When a ratio of Al/Si is relatively high (that is, 150%), Al-based nano-absorbers are rapidly generated at early growth. When a ratio of Al/Si is relatively low (that is, 80%), it takes about 10 min for Al to be completely exposed to HCl.

Figure 27:
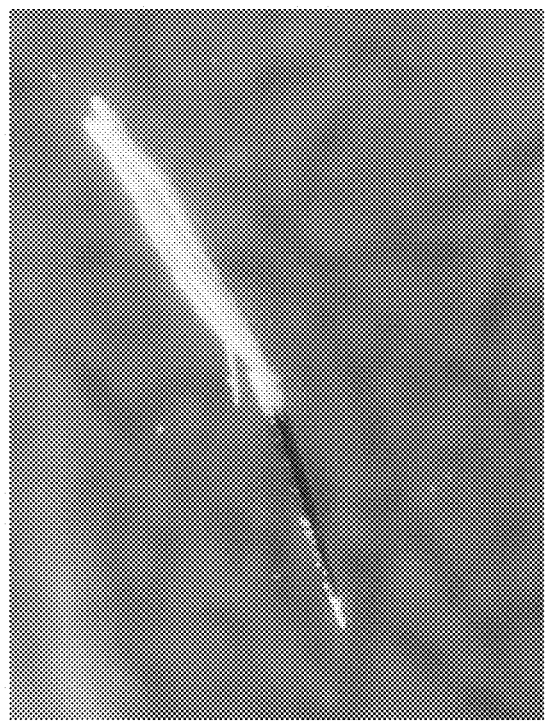
FIG. 27 shows a sample in which Al-based nano-absorbers and hexagonal silicon crystals are mixed in a crystal growth part.

FIG. 27 shows a sample in which Al-based nano-absorbers and hexagonal silicon crystals are mixed in a crystal growth part 220. The sample shows that hexagonal silicon crystals are mixed with Al-based nano-absorbers at a growth time of 80 min.

Table 2 shows generation conditions and experimental data for hexagonal SiC crystals according to another embodiment of the present invention.

TABLE 2

| | Condition | Experiments |
|---|---|---|
| Temperature of reaction tube | 1200-1350° C. | 1200° C. |
| hydrogen chloride gas | 200-1000 sccm | 500 sccm |
| Growth time | 1-5 h | 10-80 min |
| Amount of silicon | 10-100 g | 20 g |
| Amount of carbon | 10-100 g | 20 g |
| Amount of gallium | 10-100 g or less | 20 g |
| Amount of aluminum | 10-100 g or less | 25 g or less |
| Ammonia gas | 200-1000 sccm | 500 sccm |
| Nitrogen gas | 1000-5000 sccm | 5000 sccm |
| Doping material | Mg, Te, Ge, B, P, Sb | — |
| Efficiency forming Al-based nano-absorbers | 150% (Al/Si ratio) | 100% in growth time of 10 min |
| | 80% (Al/Si ratio) | 60% in growth time of 10 min |

Silicon and carbon are mixed and placed in the source allocating part 210 of the second allocating area 212. It is preferred that silicon is placed under carbon.

Hydrogen chloride, ammonia, and nitrogen gases were uniformly provided at 500 sccm, 500 sccm, and 5000 sccm, respectively, in order to grow hexagonal SiC crystals. Growth temperature and growth time were set to 1200° C. and 10-80 min, respectively. When Al/Si ratio were 150% and 80%, efficiencies forming Al-based nano-absorbers were 100% and 60% at maximum, respectively, in growth time of 10 min. A mass ratio of silicon: carbon: aluminum: gallium is 0.80-1.5:0.80-1.5:1.25:1. That is, a ratio of aluminum to silicon ranges from 80%-150%, while a ratio of aluminum to carbon ranges from 100%-150%.

Figure 28:
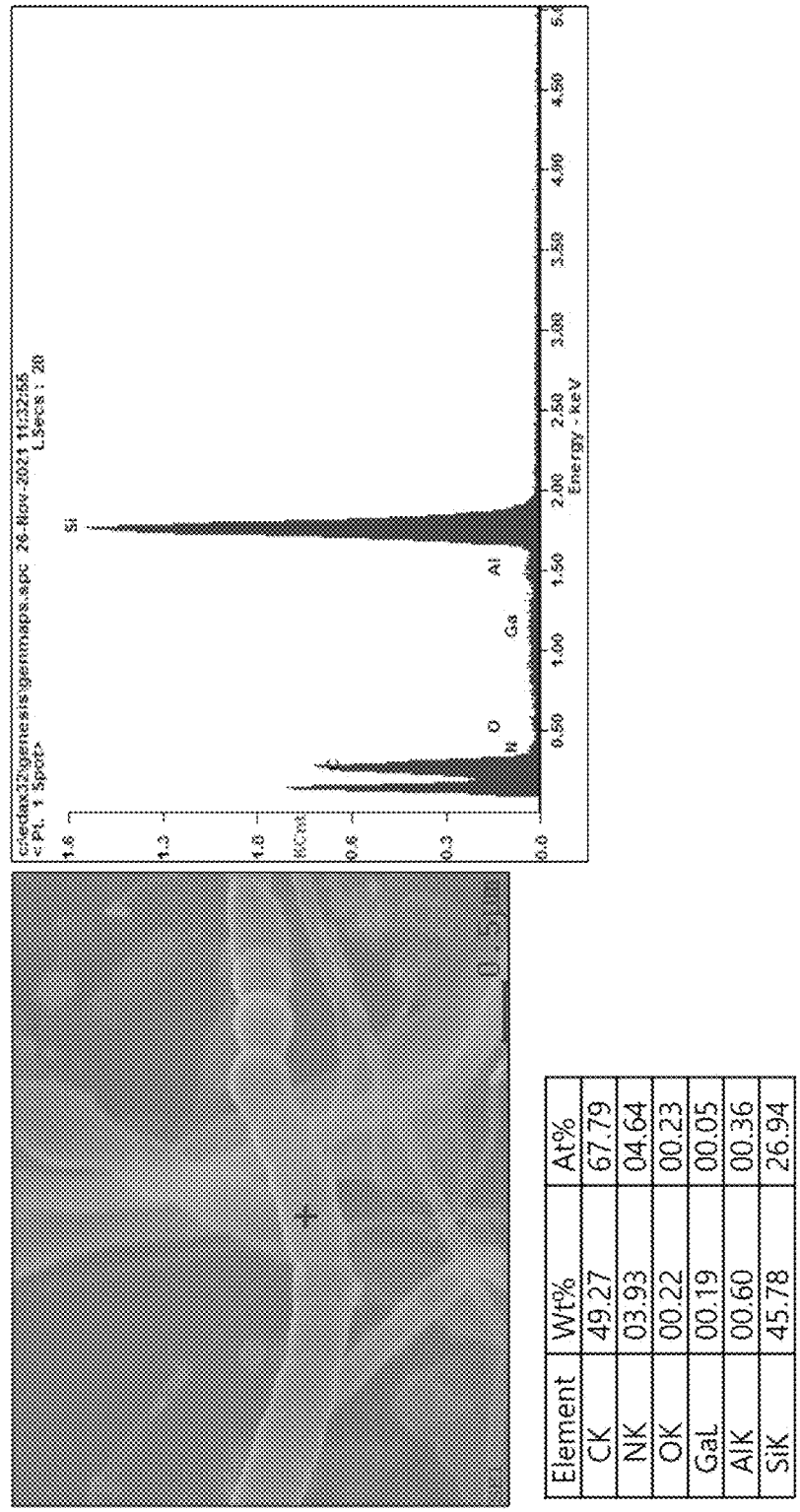
FIG. 28 shows a SEM picture and EDS data of hexagonal SiC grown according to an experimental example of the present invention.

FIG. 28 shows EDS data of hexagonal SiC crystals at a point indicated in a red box. It is noted that the hexagonal SiC crystal contain 80% or more of C, 26% of Si, and remainders of N, O, Al, and so forth.

Table 3 shows generation conditions and experimental data for hexagonal Ge crystals according to still another embodiment of the present invention.

TABLE 3

| | Condition | Experiments |
|---|---|---|
| Temperature of reaction tube | 900-1350° C. | 1200° C. |
| Hydrogen chloride gas | 200-1000 sccm | 500 sccm |
| Growth time | 1-5 h | 10-80 min |
| Amount of Ge | 10-250 g | 20 g |
| Amount of gallium | 10-100 g or less | 20 g |
| Amount of aluminum | 10-100 g or less | 25 g or less |
| Ammonia gas | 200-1000 sccm | 500 sccm |
| Nitrogen gas | 1000-5000 sccm | 5000 sccm |
| Doping material | Mg, Te, Ge, B, P, Sb | — |
| Efficiency forming Al-based nano-absorbers | 150% (Al/Si ratio) | 100% in growth time of 10 min |
| | 80% (Al/Si ratio) | 60% in growth time of 10 min |

Hydrogen chloride, ammonia, and nitrogen gases were uniformly provided at 500 sccm, 500 sccm, and 5000 sccm, respectively, in order to grow hexagonal Ge crystals. Growth temperature and growth time were set to 1200° C. and 10-80 min, respectively. When Al/Si ratio were 150% and 80%, efficiencies forming Al-based nano-absorbers were 100% and 60% at maximum, respectively, in growth time of 10 min. A mass ratio of Ge:Si:aluminum:gallium is 1.25-2.5: 0.1-0.6:1.25: 1. That is, a ratio of Si/Ge ranges from 5%-50%.

Figure 29:
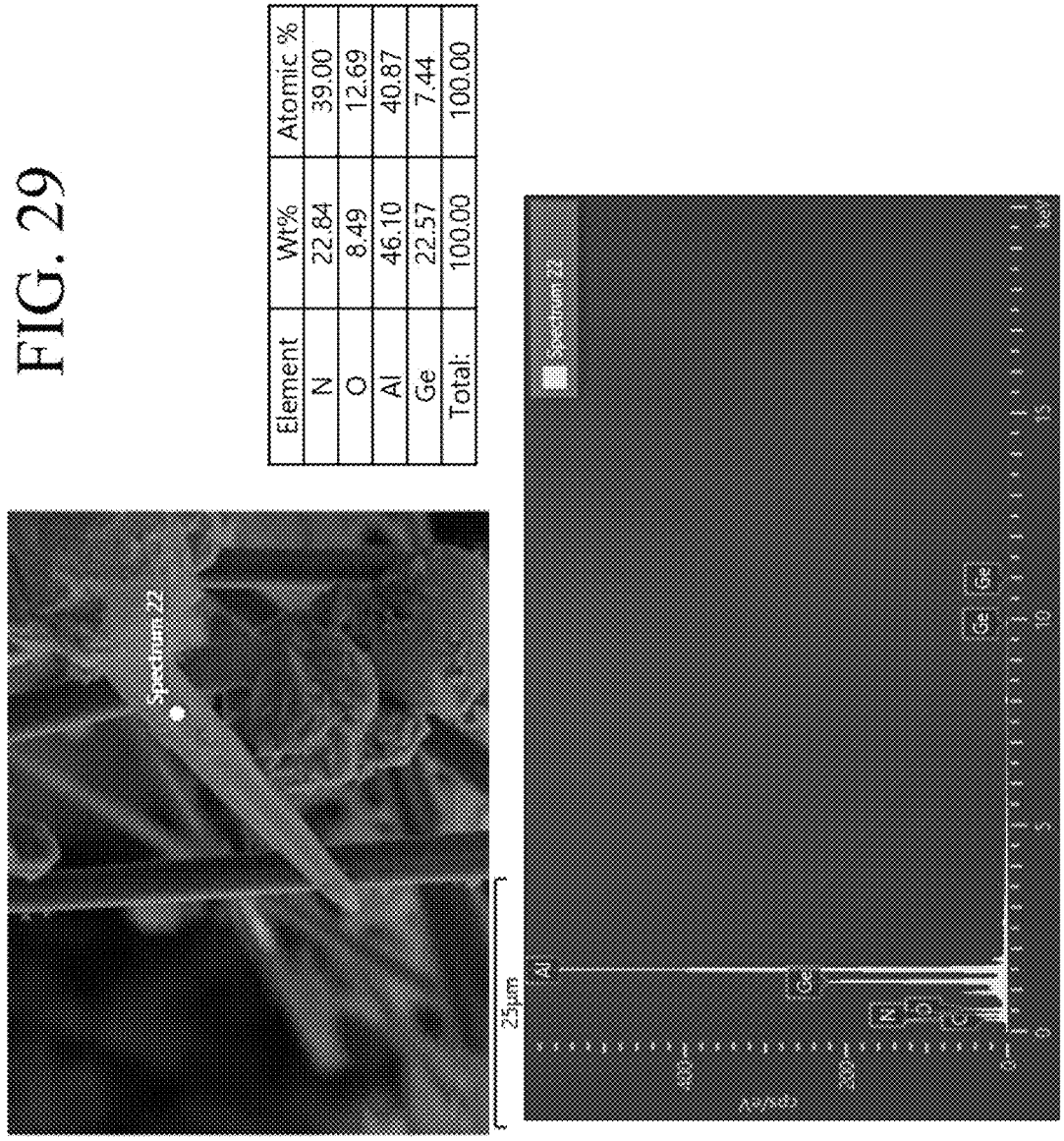
FIG. 29 shows a SEM picture and EDS data of hexagonal Ge crystal grown according to an experimental example of the present invention.

FIG. 29 shows EDS data of hexagonal Ge crystals at a red point. It is noted that the hexagonal Ge crystal contain 22% or more of Ge. From the data, Al is observed at 40% which originated from Al-based nano-absorber. This means that the sample is in a state before complete hexagonal Ge crystallization.

Table 4 shows generation conditions and experimental data for hexagonal carbon crystals according to still another embodiment of the present invention.

TABLE 4

| | Condition | Experiments |
|---|---|---|
| Temperature of reaction tube | 1200-1350° C. | 1200° C. |
| hydrogen chloride gas | 200-1000 sccm | 500 sccm |
| Growth time | 1-5 h | 10-80 min |
| Amount of carbon | 10-500 g | 100 g |
| Amount of gallium | 10-100 g or less | 20 g |
| Amount of aluminum | 10-100 g or less | 25 g or less |
| Ammonia gas | 200-1000 sccm | 500 sccm |
| Nitrogen gas | 1000-5000 sccm | 5000 sccm |
| Doping material | Mg, Te, Ge, B, P, Sb | — |
| Efficiency forming Al-based nano-absorbers | 150% (Al/Si ratio) | 100% in growth time of 10 min |
| | 80% (Al/Si ratio) | 60% in growth time of 10 min |

Hydrogen chloride, ammonia, and nitrogen gases were uniformly provided at 500 sccm, 500 sccm, and 5000 sccm, respectively, in order to grow hexagonal carbon crystals. Growth temperature and growth time were set to 1200° C. and 10-80 min, respectively. When Al/Si ratio were 150% and 80%, efficiencies forming Al-based nano-absorbers were 100% and 60% at maximum, respectively, in growth time of 10 min. A mass ratio of C: aluminum: gallium is 1.25-1.5:1.25:1. That is, a ratio of aluminum/C ranges from 100%-150%.

Table 5 shows generation conditions and experimental data for hexagonal $Si_{1-x}Ge_x$ crystals according to another embodiment of the present invention.

TABLE 5

| | Condition | Experiments |
|---|---|---|
| Temperature of reaction tube | 1200-1350° C. | 1200° C. |
| Hydrogen chloride gas | 200-1000 sccm | 500 sccm |
| Growth time | 1-5 h | 10-80 min |
| Amount of silicon | 10-100 g | 20 g |
| Amount of Ge | 10-250 g | 20 g |
| Amount of gallium | 10-100 g or less | 20 g |
| Amount of aluminum | 10-100 g or less | 25 g or less |
| Ammonia gas | 200-1000 sccm | 500 sccm |
| Nitrogen gas | 1000-5000 sccm | 5000 sccm |
| Doping material | Mg, Te, Ge, B, P, Sb | — |
| Efficiency forming Al-based nano-absorbers | 150% (Al/Si ratio) | 100% in growth time of 10 min |
| | 80% (Al/Si ratio) | 60% in growth time of 10 min |

Hydrogen chloride, ammonia, and nitrogen gases were uniformly provided at 500 sccm, 500 sccm, and 5000 sccm, respectively, in order to grow hexagonal $Si_{1-x}Ge_x$ crystals. Growth temperature and growth time were set to 1200° C. and 10-80 min, respectively. When Al/Si ratio were 150% and 80%, efficiencies for forming Al-based nano-absorbers were 100% and 60% at maximum, respectively, in growth time of 10 min. A mass ratio of Ge: aluminum: Si is 0.5-1.25:1.25: 0.5-1.25.

Figure 30:
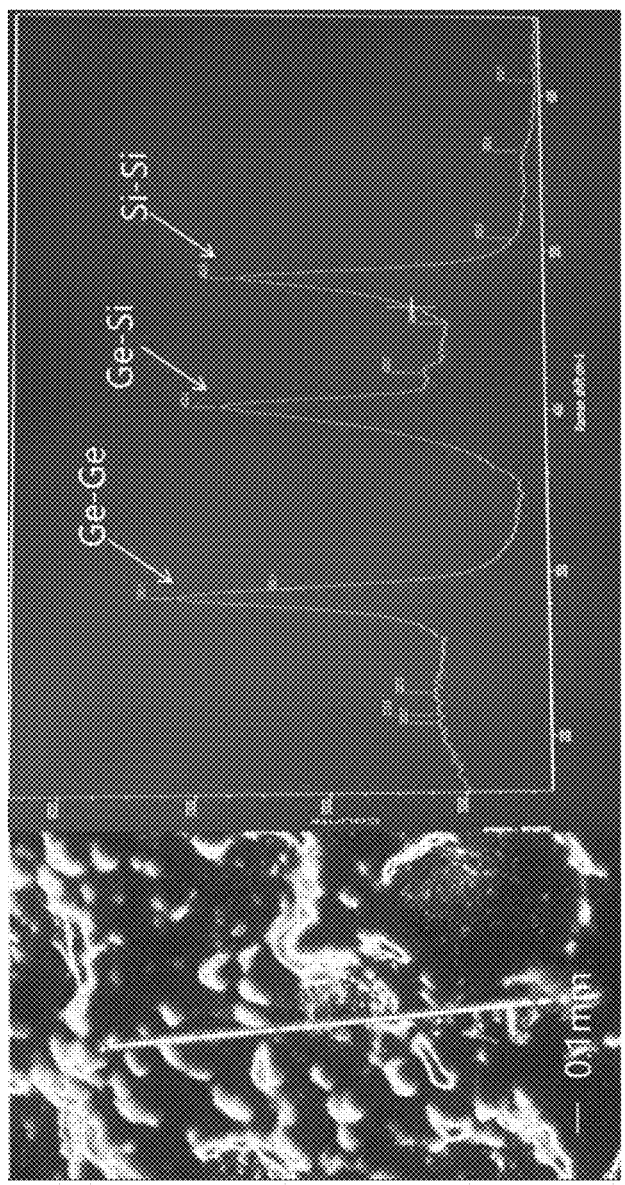
FIG. 30 shows Raman data of hexagonal $Si_{1-x}Ge_x$ crystals ($0.35<x<1$).

FIG. 30 shows an optical photo of a bar with a length of 1.2 mm and a width of 10-20 μm and Raman data for hexagonal $Si_{1-x}Ge_x$ crystals (0.35<x<1). It is noted from Raman data that a vibration relating to Ge—Ge is observed at 285 $cm^{-1}$, a vibration relating to Ge—Si is observed at 482 $cm^{-1}$, and a vibration relating to Si—Si is observed at 482 $cm^{-1}$, whose intensities are Ge—Ge>Ge—Si>Si—Si in order. Vibration relating to hexagonal $Si_{1-x}Ge_x$ crystals (x<0.35) is observed at 516 $cm^{-1}$ for Si—Si, while vibration for Ge—Ge or Ge—Si is hardly observed. When x is at 0.35<x<1, vibration for Si—Si is observed at 480-485 $cm^{-1}$, vibration for Ge—Ge is observed strongly at −285 $cm^{-1}$, and vibration for Ge—Si is observed weakly around 482 $cm^{-1}$. This result indicates that Ge affects low frequency components and Si affects high frequency components. Therefore, the Si—Ge vibration mode, which is an intermediate mode, shows a very strong peak for the composition of 0.4×0.6.

Table 6 shows generation conditions and experimental data for hexagonal $Ga_2O_3$ crystals according to another embodiment of the present invention.

TABLE 6

| | Condition | Experiments |
|---|---|---|
| Temperature of reaction tube | 650-1200° C. | 900° C. |
| Hydrogen chloride gas | 200-1000 sccm | 500 sccm |
| Growth time | 1-5 h | 10-80 min |
| Oxygen gas | 10-500 sccm | 50 sccm |
| Amount of gallium | 10-100 g or less | 20 g |
| Amount of aluminum | 10-100 g or less | 25 g or less |
| Ammonia gas | 200-1000 sccm | 500 sccm |
| nitrogen gas | 1000-5000 sccm | 5000 sccm |
| Doping material | Mg, Te, Ge, B, P, Sb | — |
| Efficiency forming Al-based nano-absorbers | 150% (Al/Si ratio) | 100% in growth time of 10 min |
| | 80% (Al/Si ratio) | 60% in growth time of 10 min |

Oxygen of hexagonal $Ga_2O_3$ crystals is supplied by nitrogen gas containing mist through bubbling distilled water with nitrogen. Hydrogen chloride, ammonia, and nitrogen gases were uniformly provided at 500 sccm, 500 sccm, and 5000 sccm, respectively, in order to grow hexagonal $Ga_2O_3$ crystals. Growth temperature and growth time were set to 900° C. and 10-80 min, respectively. When Al/Si ratio were 150% and 80%, efficiencies forming Al-based nano-absorbers were 100% and 60% at maximum, respectively, in growth time of 10 min. A mass ratio of oxygen: aluminum: gallium is 0.5-1.25:1.25:0.5-1.25. That is, a ratio of aluminum/Ga ranges from 5%-100%.

Figure 31:
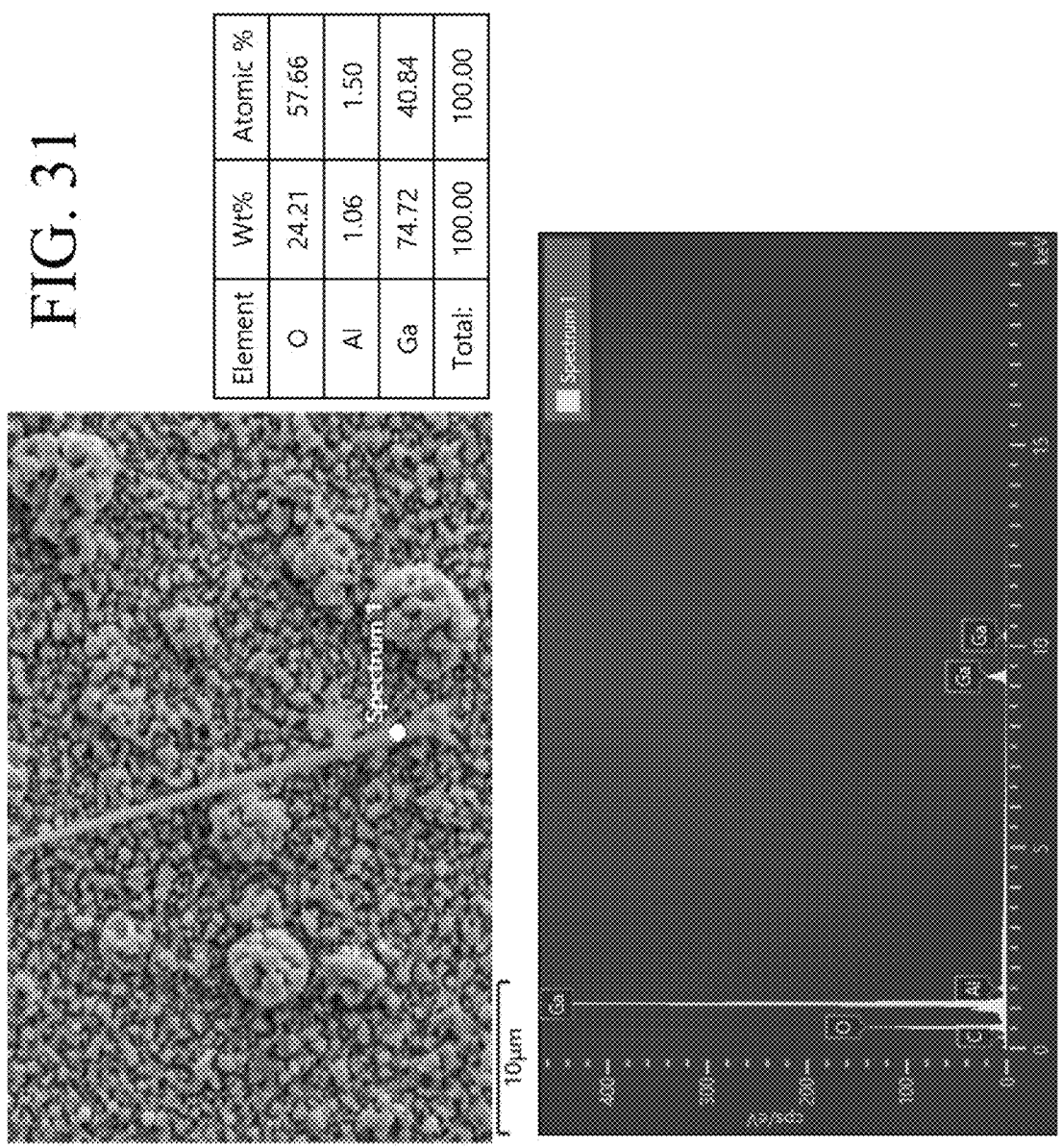
FIG. 31 shows a SEM picture and EDS data of hexagonal $Ga_2O_3$ crystal grown according to an experimental example of the present invention.

FIG. 31 shows a SEM photo and EDS data of hexagonal $Ga_2O_3$ crystals at a point indicated. It is noted that the hexagonal $Ga_2O_3$ crystal contain 40% or more of Ga, 57% or more of 0, and remainders of N, O, Al, and so forth. From the data, Al is observed at 1.5%, which means that hexagonal $Ga_2O_3$ crystals are formed from the Al-based nano-absorber.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A method for manufacturing hexagonal crystals, comprising the steps of:
    providing a source allocating part in a reaction tube, comprising:
    disposing solid aluminum in a first allocating area which is formed around at least one penetration hole on a bottom surface; and
    disposing a mixture of a main material of the hexagonal crystal and gallium in a second allocating area which is formed around the first allocating area,
    providing a crystal growth part beneath with a depressed growth mold of the source allocating part,
    heating the reaction tube in a temperature range of 900-1350° C.;
    supplying a halogenation reaction gas and a nitrification reaction gas to the source allocating part;
    generating chloride gas of the main material and gallium chloride gas by reacting the main material and gallium with the halogenation reaction gas, respectively;
    generating aluminum chloride gas by reacting aluminum with the halogenation reaction gas;
    generating Al-based nano-absorbers in the crystal growth part by reacting the generated chloride gas of the main material, gallium chloride gas, and aluminum chloride gas with the nitrification reaction gas;
    generating AlN nuclei by reacting the Al-based nano-absorbers with the nitrification reaction gas;
    generating nuclei of hexagonal crystals by reacting chloride gas of the main material with the nitrification reaction gas and then substituting the AlN nuclei with precursors of the main material; and
    growing hexagonal crystals around the generated nuclei.

2. The method for manufacturing hexagonal crystals of claim 1, wherein the step of growing hexagonal crystals comprises
    growing hexagonal crystals having a shape of a needle.

3. The method for manufacturing hexagonal crystals of claim 2, wherein the step of growing hexagonal crystals comprises
    growing hexagonal crystals having a shape of a snowflake, after growing hexagonal crystals having a shape of a needle.

4. The method for manufacturing hexagonal crystal of claim 1, further comprising the step of
    providing a substrate in the growth mold of the crystal growth part,
    wherein the substrate is selected from a group comprising graphite, silicon carbide, silicon, sapphire, quartz, ceramic, GaN, GaAs, InP, and $Ga_2O_3$.

5. The method for manufacturing hexagonal crystals of claim 1, wherein a mass ratio of the main material: aluminum: gallium is 0.80-1.5:1.25: 1.

6. The method for manufacturing hexagonal crystals of claim 1, wherein a lower diameter of the penetration hole is smaller than an upper diameter of the of the penetration hole, so that flow rates of gases passing through the penetration hole increase.

7. The method for manufacturing hexagonal crystals of claim 1, wherein the first allocating area is disposed higher than the second allocating area, so that melted main material or melted gallium in the second allocating area is prevented from flowing into the penetration hole.

8. The method for manufacturing hexagonal crystals of claim 1, wherein the main material is in solid state and selected from a group consisting of Si, C, Ge, and Ga.

9. The method for manufacturing hexagonal crystals of claim 1, wherein the hexagonal crystals include hexagonal silicon crystals, hexagonal carbon crystals, SiC crystals, hexagonal Ge crystals, hexagonal $Si_{1-x}Ge_x$ crystals ($0.35<x<1$), and hexagonal $Ga_2O_3$ crystals.

* * * * *